(12) United States Patent
Matsushita

(10) Patent No.: US 11,490,552 B2
(45) Date of Patent: *Nov. 1, 2022

(54) COMPONENT VERIFICATION SYSTEM

(71) Applicant: YAMAHA HATSUDOKI KABUSHIKI KAISHA, Iwata (JP)

(72) Inventor: Yoichi Matsushita, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 844 days.

This patent is subject to a terminal disclaimer.

(21) Appl. No.: 16/347,640

(22) PCT Filed: Nov. 9, 2016

(86) PCT No.: PCT/JP2016/083253
§ 371 (c)(1),
(2) Date: May 6, 2019

(87) PCT Pub. No.: WO2018/087848
PCT Pub. Date: May 17, 2018

(65) Prior Publication Data
US 2020/0329596 A1 Oct. 15, 2020

(51) Int. Cl.
H05K 13/08 (2006.01)
H05K 13/04 (2006.01)
(Continued)

(52) U.S. Cl.
CPC ......... H05K 13/08 (2013.01); G05B 19/4183 (2013.01); H05K 13/02 (2013.01);
(Continued)

(58) Field of Classification Search
CPC .... H05K 13/08; H05K 13/02; H05K 13/0419; H05K 13/086; G05B 2219/3103
See application file for complete search history.

(56) References Cited

U.S. PATENT DOCUMENTS 7,568,624 B2 * 8/2009 Kodama ............... H05K 13/086
235/462.43
2015/0034714 A1 * 2/2015 Koyanagi ................ G06K 7/10
235/375
(Continued)

FOREIGN PATENT DOCUMENTS

CN 102340982 A 2/2012
CN 103190210 A 7/2013
(Continued)

OTHER PUBLICATIONS

International Search Report issued in PCT/JP2016/083253; dated Feb. 7, 2017.

Primary Examiner — Peter Dungba Vo
Assistant Examiner — Jose K Abraham
(74) Attorney, Agent, or Firm — Studebaker & Brackett PC

(57) ABSTRACT

A part verification system includes sensors for detecting tapes, a reader which reads identification information from a recording part provided to a reel, and a memory part which stores part verification information. The system further includes part verification part which performs verification updating processing for determining whether or not the tape is mounted on the tape feeder at the set position corresponding to the identification information, and updating tape presence or absence information at the set position when the tape is mounted, a tape monitoring part for determining whether or not the tape is mounted with respect to each tape feeder during a period which differs from a period where the verification updating processing is performed, and a notification part which performs notification to request reading of the identification information relating to the tape from the recording part when the tape is mounted on the tape feeder.

15 Claims, 21 Drawing Sheets

(51) Int. Cl.
*G05B 19/418* (2006.01)
*H05K 13/02* (2006.01)

(52) U.S. Cl.
CPC ....... *H05K 13/0419* (2018.08); *H05K 13/086* (2018.08); *G05B 2219/31037* (2013.01)

(56) References Cited

U.S. PATENT DOCUMENTS

| | | | |
|---|---|---|---|
| 2015/0083845 A1* | 3/2015 | Kawaguchi | H05K 13/0419 242/563 |
| 2015/0110588 A1 | 4/2015 | Ohyama et al. | |
| 2015/0189801 A1* | 7/2015 | Yanagida | H05K 13/0419 221/25 |
| 2015/0212503 A1* | 7/2015 | Shimizu | H05K 13/0215 235/375 |
| 2016/0353624 A1* | 12/2016 | Maezono | H05K 13/0417 |
| 2018/0042152 A1 | 2/2018 | Ohyama et al. | |

FOREIGN PATENT DOCUMENTS

| | | |
|---|---|---|
| EP | 0967850 B1 | 12/2001 |
| JP | 2009177218 A | 8/2009 |
| JP | 2012104635 A | 5/2012 |
| JP | 2014011291 A | 1/2014 |
| JP | 2014011328 A | 1/2014 |

\* cited by examiner

FIG. 10

| SET POSITION | PART ID | PART NAME | ... |
|---|---|---|---|
| F001 | P12345 | PARTS-001 | ... |
| F002 | P22345 | PARTS-002 | ... |
| F003 | P22346 | PARTS-010 | ... |
| F004 | P23345 | PARTS-011 | ... |
| F005 | P23346 | PARTS-012 | ... |
| ⋮ | ⋮ | ⋮ | ⋮ |

COMPONENT VERIFICATION SYSTEM

CROSS-REFERENCE TO RELATED APPLICATION

This application is a National Stage of International Patent Application No. PCT/JP2016/083253, filed Nov. 9, 2016, the entire content of which is incorporated herein by reference.

BACKGROUND

Technical Field

The present disclosure relates to a technique for automatically mounting parts using a part mounting device provided with a tape feeder, and more particularly to a part verification technique used in mounting a tape for supplying parts to the tape feeder.

Background Art

A part mounting device includes tape feeders each of which supplies parts using a tape as a carrier. The tape feeder is provided for supplying parts to a predetermined part takeout position while intermittently feeding a tape which stores the parts (part supply tape) from a reel around which the tape is wound. In the part mounting device, a plurality of tape feeders are arranged parallel to each other and the parts supplied from these tape feeders are picked up by heads for mounting parts and are placed (mounted) on a substrate such as a circuit board.

With respect to the tape feeder, conventionally, there has been known a splicing method where an operator manually mounts a tape along a traveling path in the tape feeder, and when a remaining amount of the tape which precedes (preceding tape) becomes small, a succeeding new tape (succeeding tape) is joined to a tail end of the preceding tape thus enabling continuous supply of parts. However, recently, to improve efficiency of a part replenishing operation, a tape feeder adopting a splicing-less method (also referred to as an automatic loading method) has been becoming mainstream. In the case of the tape feeder adopting a splicing-less method, when a distal end of a tape is set at a predetermined position, the tape can be automatically loaded to a part takeout position in response to a button operation. Further, when a distal end of a succeeding tape for part replenishment is set at the predetermined position, after the entire preceding tape is fed out, the succeeding tape is automatically loaded to the part takeout position, and an intermittent tape feeding operation of the succeeding tape is started. With such a configuration, an operator is set free from a tape loading operation and a tape joining operation which are cumbersome. That is, it is possible to improve efficiency of so-called preparation operation and part replenishing operation of the tape feeder. For example, the third embodiment in JP 2014-11328 A discloses one example of a tape feeder adopting a splicing-less method of this type.

In the tape feeder adopting a splicing-less method (hereinafter, simply referred to as the tape feeder), in setting a tape (also including a succeeding tape), it is necessary to verify whether or not the tape is correct, that is, whether or not parts are correct. Accordingly, for example, a barcode attached to a reel is read by a barcode reader, and it is determined whether or not barcode information and feeder information necessary for setting the reel agree with each other, and if these two sets of information do not agree with each other, an alarm is set off so as to inform an operator of this result.

However, in the case where the above-mentioned configuration is adopted, a following drawback arises. That is, when reading of a barcode is forgotten after setting a tape, the above-mentioned verification is not performed. In this case, even if the set tape is correct, automatic loading is not performed. As a result, there is a concern that a trouble such as a tape feeding defect occurs.

Further, in the case where a tape which is loaded once is removed and an operator loads the tape on a wrong tape feeder or in the case where an irrelevant tape is placed by accident and an operator erroneously loads the tape on any one of tape feeders, there is a concern that a similar trouble occurs eventually.

SUMMARY

Accordingly, the present disclosure provides a technique for automatically mounting parts using a part mounting device provided with a tape feeder, the technique being capable of suppressing the occurrence of a trouble caused by missing of reading of identification information such as a barcode when a tape for supplying parts is mounted on the tape feeder.

In view of the above, the present disclosure provides a part verification system for a part supply unit where a plurality of tape feeders are arranged, the part verification system being provided for determining whether or not a tape for supplying parts mounted on the tape feeder is appropriate. The part verification system includes sensors provided to the plurality of tape feeders, the sensors being configured to detect tapes, respectively; a reader configured to read identification information of an accommodated part from a recording part which records the identification information and is provided to a tape or a reel around which the tape is wound; and a memory part configured to store part verification information obtained by correlating set position information which is information on a set position of the tape feeders in the part supply unit with the identification information. The part verification system further includes a part verification part configured to perform verification updating processing for determining, when the identification information of the tape is read using the reader, whether or not the tape is actually mounted on the tape feeder at the set position corresponding to the identification information based on the identification information, the part verification information and an output from the sensor, and updating tape presence or absence information at the set position when the part verification part determines that the tape is mounted; a tape monitoring part configured to perform tape detection processing for determining whether or not the tape is mounted with respect to each tape feeder based on the output from the sensor and the tape presence or absence information during a period which differs from a period where the verification updating processing is performed; and a notification part configured to notify so as to request reading of the identification information relating to the tape from the recording part when the tape monitoring part determines that the tape is mounted on the tape feeder.

BRIEF DESCRIPTION OF THE DRAWINGS

FIG. 10 is a conceptual view showing one example of part verification data stored in a database;

DETAILED DESCRIPTION

[Configuration of Part Mounting Device]

Figure 1:
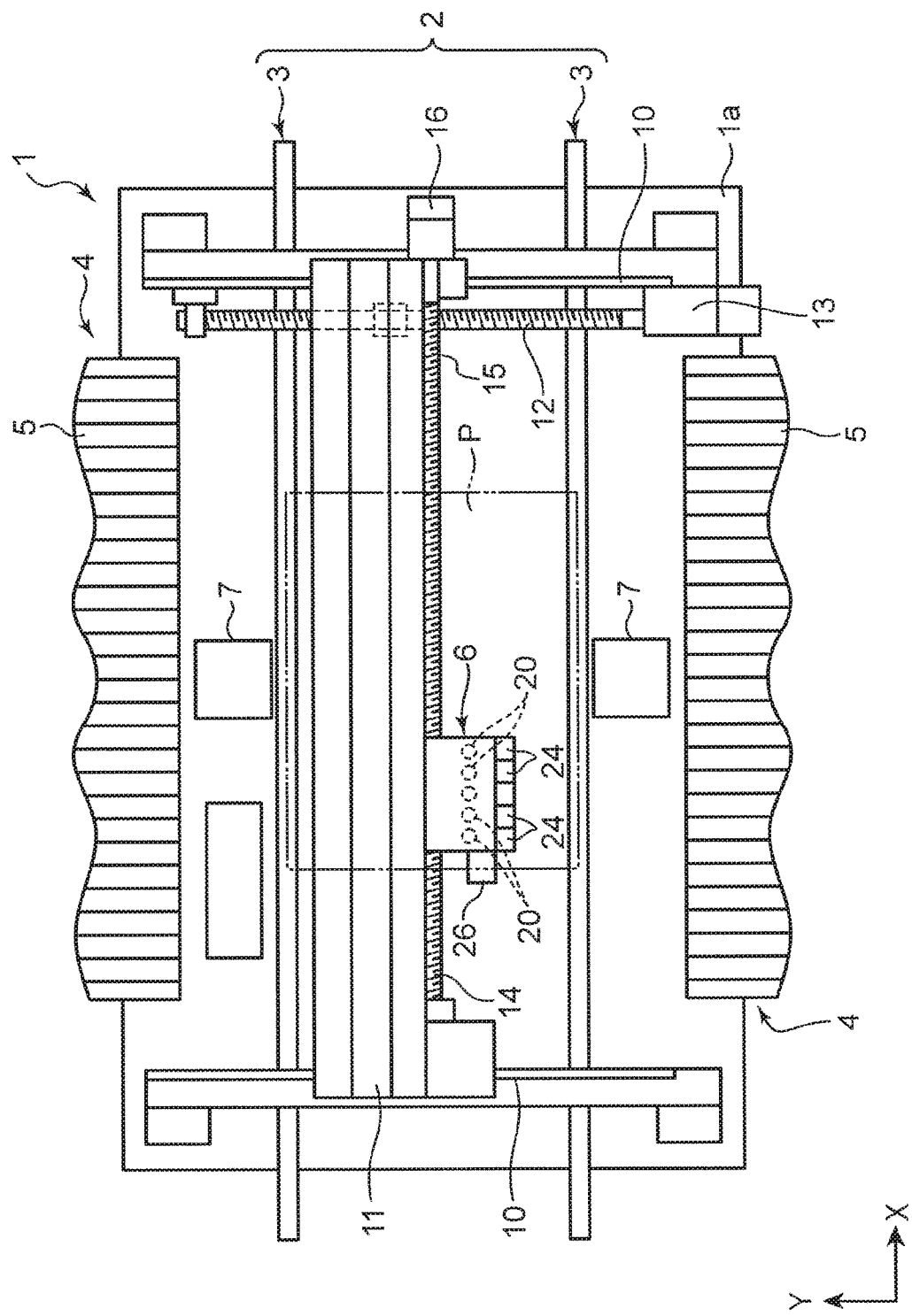
FIG. 1 is a plan view of a part mounting device.

FIG. 1 is a plan view of a part mounting device to which the present disclosure is applied. In the drawings, to clarify a directional relationship in each drawing, XYZ orthogonal coordinate axes are shown. An X direction is a direction parallel to a horizontal plane, a Y direction is a direction orthogonal to the X direction on the horizontal plane, and a Z direction is a direction orthogonal to both of X and Y directions.

The part mounting device 1 includes: a base 1a having a rectangular shape as viewed in a plan view; a substrate conveyance mechanism 2 for conveying a substrate P such as a printed circuit board on the base 1a; part supply units 4; a head unit 6; and a head unit drive mechanism for driving the head unit 6.

The substrate conveyance mechanism 2 includes: a pair of conveyors 3 for conveying the substrate P in the X direction; and a positioning mechanism, not shown, for positioning the substrate P to be conveyed by the conveyor 3. The conveyor 3 is a so-called belt conveyor. The conveyor 3 receives the substrate P from one side (right side in FIG. 1), conveys the substrate P to a predetermined mounting operation position (the position of the substrate P shown in the drawing), and after such a mounting operation, carries out the substrate P to the other side (left side in FIG. 1). The positioning mechanism is a lift-up mechanism provided with a backup pin. The positioning mechanism positions the substrate P at the mounting operation position by lifting the substrate P from the conveyor 3 and pressing the substrate P to a lower surface of a conveyance guide or the like not shown.

The part supply units 4 are disposed on both sides (both sides in the Y direction) of the substrate conveyance mechanism 2 respectively. In this embodiment, each part supply unit 4 is integrally assembled to the base 1a. That is, each part supply unit 4 is inseparably incorporated in the base 1a.

In the part supply unit 4, a plurality of tape feeders 5 are detachably disposed along the conveyor 3. The tape feeder 5 is provided for supplying a small-piece-like electronic parts such as ICs, transistors, or capacitors (hereinafter, simply referred to as parts) using a tape as a carrier. The configuration of the tape feeder 5 is described in detail later.

The head unit 6 is provided for taking out a part from each tape feeder 5 of the part supply unit 4 and for mounting the part on the substrate P. The head unit 6 moves in the X direction as well as in the Y direction within a fixed region due to an operation of a head unit drive mechanism. The head unit drive mechanism includes: a pair of fixed rails 10 fixed to high-bridge frames respectively and extending in the Y direction; a unit support member 11 movably supported on the respective fixed rails 10 and extending in the X direction; and a ball screw shaft 12 threadedly inserted into the unit support member 11 and driven by a Y-axis servo motor 13. The head unit drive mechanism also includes: a fixed rail 14 fixed to the unit support member 11 and movably supporting the head unit 6 in the X direction; and a ball screw shaft 15 threadedly inserted into the head unit 6 and driven by an X-axis servo motor 16. That is, the head unit drive mechanism moves the head unit 6 in the X direction due to driving of the ball screw shaft 15 by the X-axis servo motor 16, and moves the unit support member 11 in the Y direction due to driving of the ball screw shaft 12 by the Y-axis servo motor 13. As a result, the head unit 6 moves in the X direction as well as in the Y direction within the fixed region.

In this embodiment, the head unit drive mechanism is configured to move the unit support member 11 and the head unit 6 by the rotary motors (servo motors 13, 16) by way of the ball screw shafts 12, 15. However, the head unit drive mechanism may be configured to directly drive the unit support member 11 and the head unit 6 using, for example, linear motors as drive sources.

The head unit 6 includes: a plurality of shaft-like heads 20; and a head drive mechanism for driving these heads 20. In this embodiment, the head unit 6 includes five heads 20 in total arranged in a row in the X direction.

The head drive mechanism includes a lifting drive mechanism which includes Z-axis servo motors 24 which respectively correspond to the respective heads 20 and individually raises or lowers the respective heads 20 (moves the respective heads 20 in the Z direction); and a rotary drive mechanism which includes one R-axis servo motor 25 (shown in FIG. 9) shared in common by the respective heads 20 and rotates the respective heads 20 simultaneously about a head center axis (R direction).

A nozzle for sucking a part is provided to a distal end of each head 20. The respective nozzles communicate with a negative pressure generating device by way of electrically operated switching valves, respectively. When a negative pressure is supplied to the distal end of the nozzle from the negative pressure generating device, the nozzle sucks the part.

The head unit 6 also includes a substrate recognition camera 26. The substrate recognition camera 26, for identifying a type of the substrate P and for positioning the substrate P, moves together with the head unit 6, and images various marks described on an upper surface of the substrate P from above.

As shown in FIG. 1, the part recognition cameras 7 are disposed at positions between the respective part supply units 4 and the substrate conveyance mechanism 2 on the base 1a respectively. The part recognition camera 7 images a part taken out from the tape feeder 5 by the head 20 from below for recognizing a suction state of the part.

[Overall Configuration of Tape Feeder 5]

Figure 2:
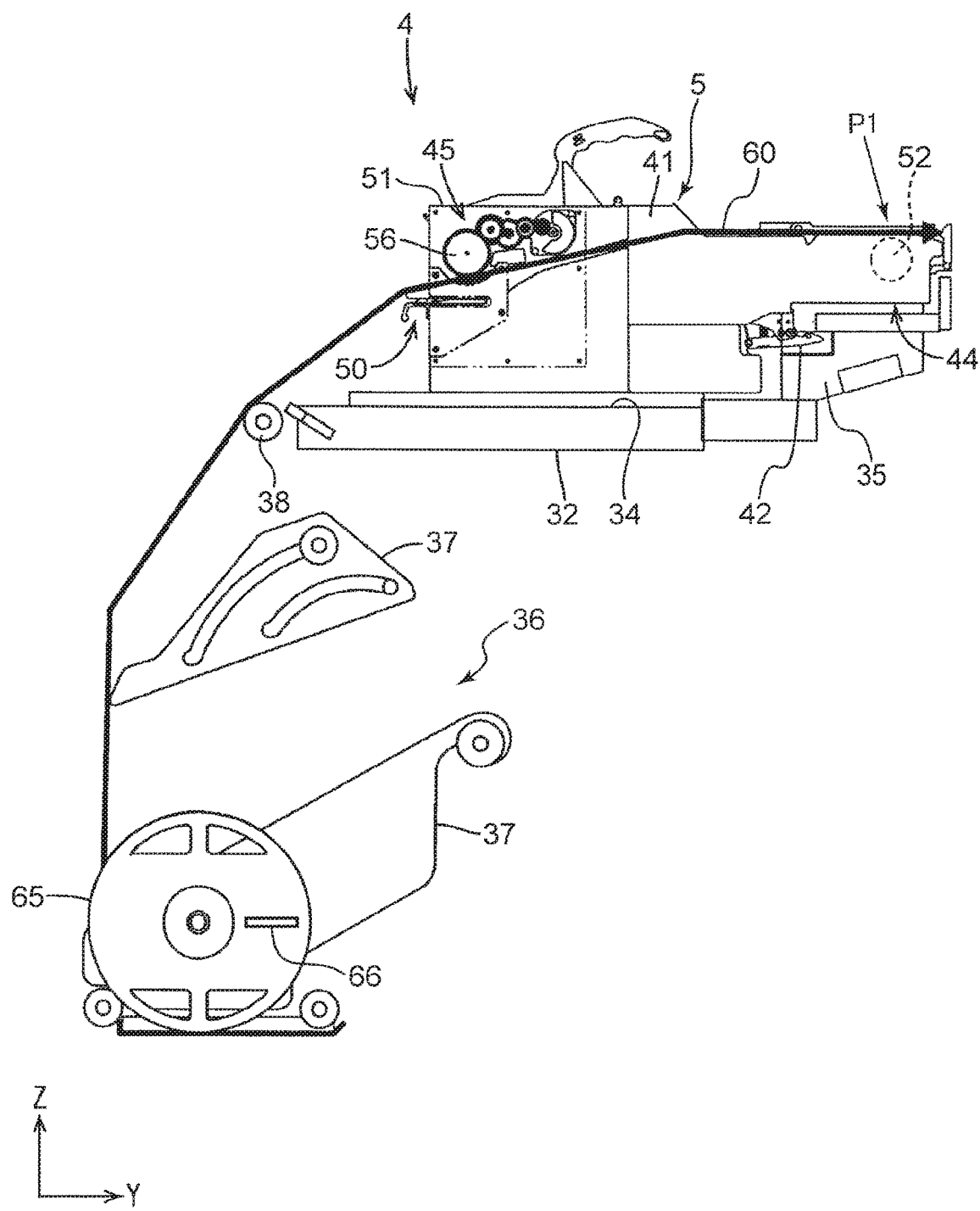
FIG. 2 is an overall schematic view of a part supply unit and a tape feeder as viewed from a side.
Figure 3:
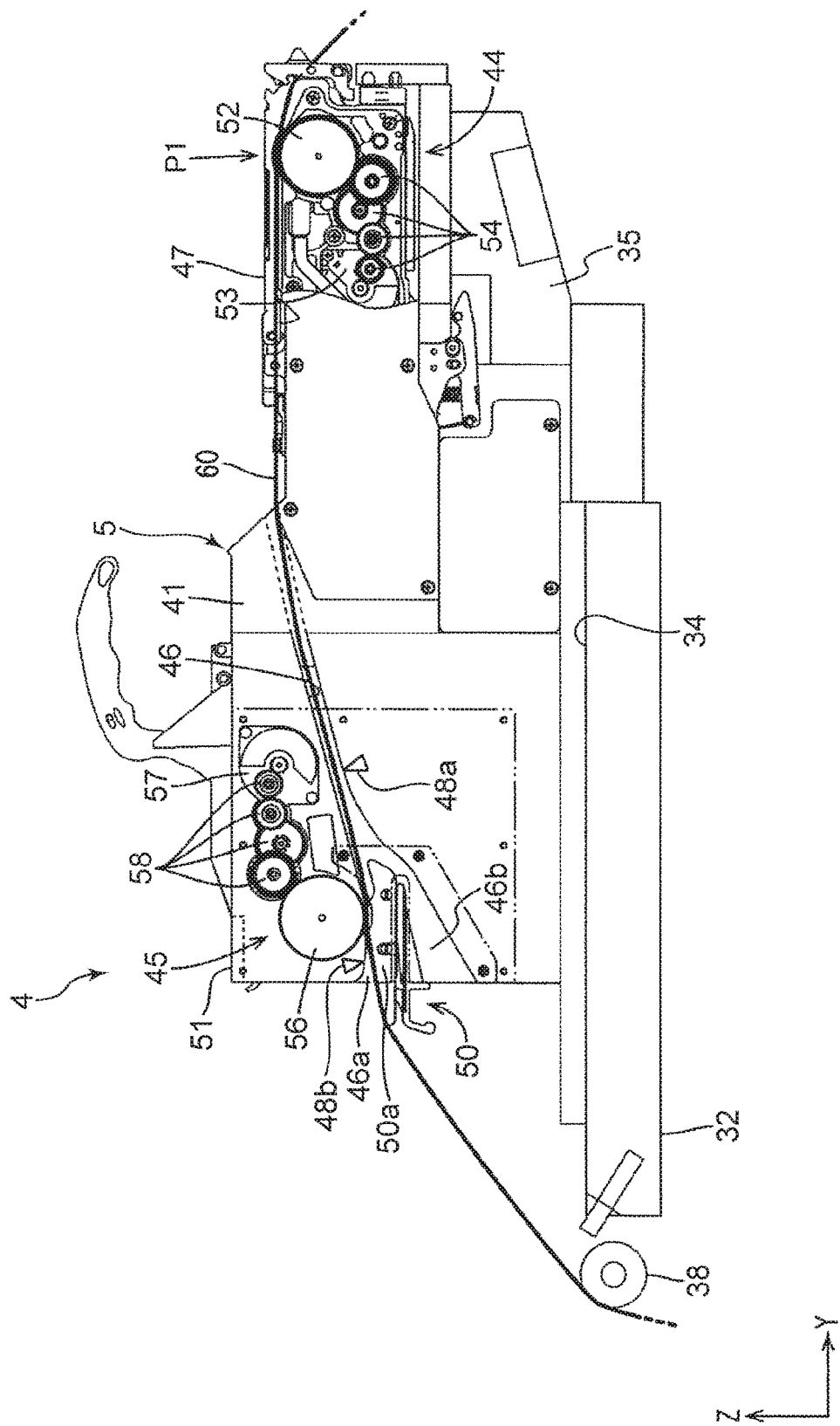
FIG. 3 is a schematic view of the tape feeder as viewed from a side.

FIG. 2 is an overall schematic view of the part supply unit 4 and the tape feeder 5 as viewed from a side, and FIG. 3 is a schematic view of the tape feeder as viewed from a side (an enlarged view of an essential part in FIG. 2). In the description of the tape feeder 5 and the part supply unit 4 made hereinafter, for the sake of convenience of the description, assume a side close to the substrate conveyance mechanism 2 (a right side in FIG. 2 and FIG. 3) as front (front side) and a side opposite to the above-mentioned side as rear (rear side).

The tape feeder 5 is mounted on a feeder mounting part 32 mounted on the part supply unit 4. To describe in detail, the part supply unit 4 includes the feeder mounting part 32 and a reel support portion 36. The feeder mounting part 32 includes: a plurality of slots 34 arranged at a fixed interval in the X direction and extending parallel to each other in the Y direction; and a fixing base 35 extending in the X direction at the position in front of these slots 34. The tape feeders 5 are set in the respective slots 34, and the respective tape feeders 5 are fixed to the fixing base 35 by a clamp mechanism 42. With such a configuration, the plurality of tape feeders 5 are disposed in the part supply unit 4 in a row side by side in the X direction.

In the reel support portion 36, reels 65 on which part supply tapes 60 are wound are supported for respective slots 34, and the part supply tapes 60 are reeled from the reel 65 to the tape feeders 5. The reel support portion 36 is positioned behind and below the feeder mounting part 32, and includes reel holders 37 which rotatably support the reel 65 at two stages, that is, upper and lower stages. Reference numeral 38 in FIG. 2 and FIG. 3 indicates a guide roller for guiding the part supply tapes 60 reeled out from the reel 65 toward the tape feeders 5, and provided at a rear end portion of the feeder mounting part 32 corresponding to the respective slots 34.

The tape feeder 5 includes: a feeder body portion 41 having an elongated shape in the longitudinal direction (Y direction); and the clamp mechanism 42 disposed in front of and below the feeder body portion 41. The tape feeder 5 is fixed to the fixing base 35 by the clamp mechanism 42 in a state where the feeder body portion 41 is inserted (set) in the slot 34.

The tape feeder 5 also includes: a front side feeding portion 44 disposed on a front end portion of the feeder body portion 41; a rear side feeding portion 45 disposed at a rear end portion of the feeder body portion 41; a tape path 46 formed in the feeder body portion 41; a tape guide 47; first and second tape detection sensors 48a, 48b; a feeder control part 49 (see FIG. 9); a tape support member 50 detachably fixed to a rear end portion of the feeder body portion 41; and an operation part 51 disposed on an upper surface of a rear portion of the feeder body portion 41.

The tape path 46 is a path for guiding the part supply tape 60. The tape path 46 extends from a rear end portion of the feeder body portion 41 obliquely and upwardly toward an upper portion of a front side of the feeder body portion 41. As shown in FIG. 3, the part supply tape 60 is introduced into the feeder body portion 41 from the rear end portion of the feeder body portion 41, and is guided to a front portion of an upper surface of the feeder body portion 41 through the tape path 46.

Figure 4:
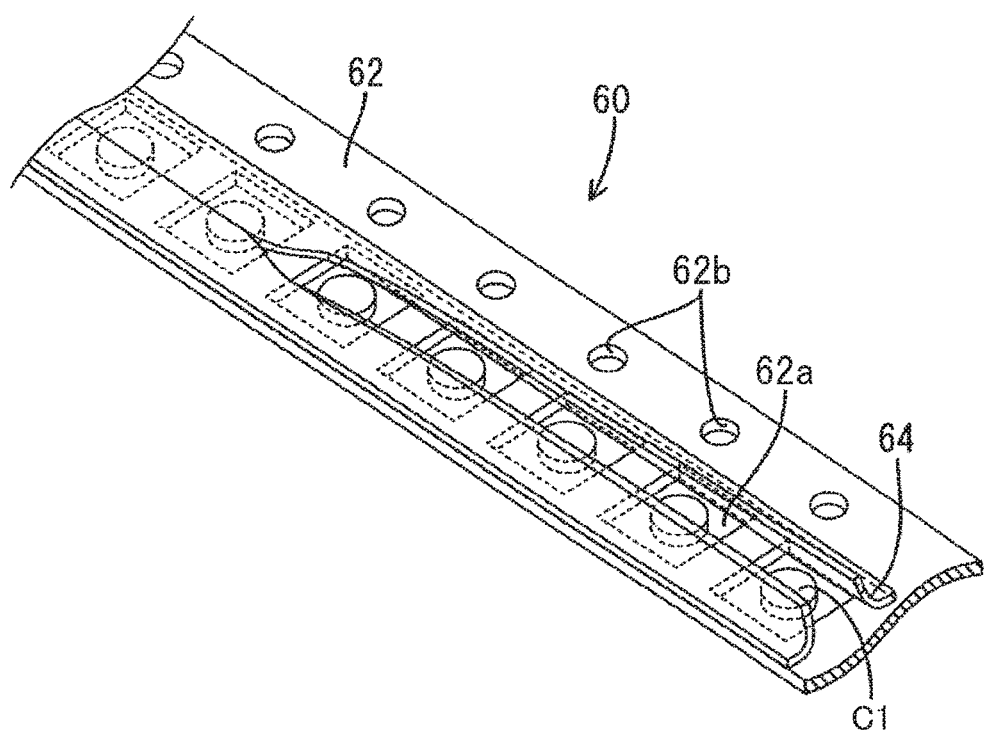
FIG. 4 is a perspective view of a part supply tape.

As shown in FIG. 4, the part supply tape 60 is an elongated tape formed of a tape body 62 and a cover tape 64. A large number of part accommodating portions 62a (recessed portions) which open upward are formed in the tape body 62 at a fixed interval in the longitudinal direction, and a part C1 is accommodated in the respective part accommodating portions 62a. The cover tape 64 adheres to an upper surface of the tape body 62 so as to seal the respective part accommodating portions 62a by the cover tape 64. A plurality of engaging holes 62b which are arranged at a fixed interval in the longitudinal direction and penetrate the tape body 62 in a thickness direction of the tape body 62 are formed in the tape body 62 on a side of the part accommodating portions 62a.

As shown in FIG. 2, the part supply tape 60 is wound around the reel 65. The reel 65 is rotatably supported by the reel holder 37. The part supply tape 60 is reeled out from the reel 65, and is guided to a front portion of the upper surface of the feeder body portion 41 through the tape path 46.

As shown in FIG. 3, the tape guide 47 is disposed on the upper surface of the front portion of the feeder body portion 41. The tape guide 47 covers the part supply tape 60 which passes the tape path 46, and is provided for guiding the part supply tape 60 to a part supply position P1 approximately horizontally along the upper surface of the feeder body portion 41. The part supply position P1 is the position where a part is taken out by the head 20, and is set at the position close to the front end of the upper surface of the feeder body portion 41.

An opening portion not shown is formed in the tape guide 47 at the position corresponding to the part supply position P1, and a cut mechanism not shown for cutting the cover tape 64 is disposed at the position behind the opening portion. As shown in FIG. 4, the cut mechanism is configured to fold the cover tape 64 toward the outside while cutting the cover tape 64 in the longitudinal direction at the center of the cover tape 64 in the width direction. With such a configuration, the parts C1 accommodated in the part accommodating portions 62a are exposed at the part supply position P1 so as to enable sucking of the parts by the heads 20 through the opening portion.

The front side feeding portion 44 includes: a front side sprocket 52 disposed below the tape guide 47; a front side motor 53; and a front side gear train 54 which transmits a drive force of the front side motor 53 to the front side sprocket 52 and is formed of a plurality of power transmission gears. The front side sprocket 52 has teeth which engage with the engaging hole 62b of the part supply tape 60 guided along the tape guide 47. That is, the front side feeding portion 44 feeds the part supply tape 60 toward the part supply position P1 by rotatably driving the front side sprocket 52 by the front side motor 53.

The rear side feeding portion 45 includes: a rear side sprocket 56 disposed on a rear end portion of the feeder body portion 41; a rear side motor 57; and a rear side gear train 58 which transmits a drive force of the rear side motor 57 to the rear side sprocket 56 and is formed of a plurality of power transmission gears. The rear side sprocket 56 has teeth which face the inside of the tape path 46 from above and engage with the engaging holes 62b of the part supply tape 60 guided along the tape path 46. That is, the rear side feeding portion 45 feeds the part supply tape 60 toward a front side (part supply position P1) by rotatably driving the rear side sprocket 56 by the rear side motor 57.

The part supply tape 60 is fed toward the part supply position P1 by the respective feeding portions 44, 45, and the parts are taken out through the opening portion at the part supply position P1. A tape recovery container not shown is disposed in front of the reel support portion 36. As shown in FIG. 3, the part supply tape 60 is guided downward from a front end of the feeder body portion 41 after the parts are taken out from the part supply tape 60, and is recovered in the tape recovery container while being finely shredded by a cutter not shown.

As shown in FIG. 3, the tape support member 50 divides a rear end portion of the tape path 46 into two upper and lower paths (an upper side path 46a, a lower side path 46b), and supports from below the part supply tape 60 which passes the upper side path 46a. To describe in detail, a rear end portion of the tape path 46 has a shape expanding in a vertical direction from a front side to a rear side of the rear end portion. The tape support member 50 is inserted in the tape path 46 from behind the feeder body portion 41, and is detachably fixed to the feeder body portion 41. With such a configuration, the rear end portion of the tape path 46 is divided into the upper side path 46a and the lower side path 46b by the tape support member 50.

As described previously, the rear side sprocket 56 faces the inside of the upper side path 46a, and engages with the engaging holes 62b formed in the part supply tape 60 which passes the upper side path 46a. The tape support member 50 includes a support lug 50a which is elastically displaceable in the vertical direction, and the part supply tape 60 which passes the upper side path 46a is biased by the support lug 50a upward. With such a configuration, the part supply tape 60 is pressed to the rear side sprocket 56.

A first tape detection sensor 48a and a second tape detection sensor 48b are disposed in a state where both the tape detection sensors 48a, 48b face the tape path 46, and both the tape detection sensors 48a, 48b detect the presence or the absence of the part supply tape 60 which passes the tape path 46. More specifically, the first tape detection sensor 48a is disposed at the position in front of (on a right side in FIG. 3) a place where the upper side path 46a and the lower side path 46b merge with each other and the first tape detection sensor 48a faces the tape path 46 from below. On the other hand, the second tape detection sensor 48b is disposed at the position where the second tape detection sensor 48b faces the upper side path 46a from above. With such a configuration, the presence or the absence of the part supply tape 60 in the upper side path 46a is detected.

The operation part 51 is provided for allowing an operator to feed and reverse-feed the part supply tape 60 as necessary. The operation part 51 includes: operation buttons 51a for performing feeding of the tape and reverse feeding of the tape; and an LED display part 51b (see FIG. 9) showing an operation state of the tape feeder 5 and the like.

The feeder control part 49 is provided for controlling driving of the tape feeder 5. Specifically, the feeder control part 49 controls driving of the front side motor 53 and the rear side motor 57 based on an operation of the operation button 51a. The feeder control part 49 controls the LED display part 51b for notifying an operation state of the tape feeder 5 and the like. Although not shown in the drawing, the feeder mounting part 32 includes a connector for electrically connecting the respective tape feeders 5 and a controller 70 described later of the part mounting device 1 to each other. The feeder control part 49 is electrically connected to the controller 70 via the connector or the like. That is, the feeder control part 49 controls driving of the tape feeder 5 corresponding to an operation when the operation part 51 receives such an operation, and controls driving of the tape feeder 5 based on a control signal input from the controller 70. In this embodiment, the second tape detection sensor 48b corresponds to "sensor" of the present disclosure and the LED display part 51b corresponds to a display part of the present disclosure.

[Method of Mounting Part Supply Tape 60]

The above-mentioned tape feeder 5 is a tape feeder adopting a so-called splicing-less method. That is, in the tape feeder 5, when a distal end of the part supply tape 60 is set on the upper side path 46a and the operation button 51a is operated, the part supply tape 60 is automatically loaded at the part takeout position P1. On the other hand, by setting the part supply tape 60 for part replenishment in the upper side path 46a, after the whole preceding part supply tape 60 mounted on the tape feeder 5 is fed, the succeeding part supply tape 60 is automatically loaded at the part supply position P1. Hereinafter, a method of mounting the part supply tape 60 on the tape feeder 5 is described.

Firstly, the method of mounting the preceding part supply tape 60 is described.

An operator fixes the tape support member 50 to the feeder body portion 41, and mounts the reel 65 on the reel holder 37 at the lower stage of the reel support portion 36. In such an operation, to perform verification of a part, the operator reads a barcode 66 (part ID) described later which is laminated to the reel 65 by a barcode reader 84 described later. This point is further described in detail later.

Then, the part supply tape 60 is reeled out from the reel 65, and the distal end portion of the part supply tape 60 is inserted into the upper side path 46a from behind the feeder body portion 41. With such an operation, the distal end portion of the part supply tape 60 is supported on the tape support member 50 (support lug 50a) in a state where the distal end portion of the part supply tape 60 is engaged with the rear side sprocket 56.

Next, the operator presses the operation button 51a (tape feeding button) to load the part supply tape 60. Specifically, as shown in FIG. 2 and FIG. 3, the part supply tape 60 is fed to the position where the distal end portion of the part supply tape 60 engages with the front side sprocket 52. With such an operation, mounting of the preceding part supply tape 60 on the tape feeder 5 is completed.

During the part mounting operation, driving of the front side motor 53 is controlled by the feeder control part 49 based on a control signal output from the controller 70 in accordance with a mounting program. With such an operation, the part supply tape 60 is fed intermittently along with taking out of the parts by the heads 20. The rear side sprocket 56 is configured to idly rotate along with feeding of the part supply tape 60 in mounting the part. Accordingly, the rear side motor 57 is stopped in principle except for a time for loading the part supply tape 60.

Next, the method of mounting the succeeding part supply tape 60 is described with reference to FIG. 5 to FIG. 8. In FIG. 5 to FIG. 8, to differentiate the tapes, a letter "P" is affixed to a symbol of the preceding part supply tape 60, and a letter "F" is affixed to a symbol of the succeeding part supply tape 60.

Figure 5:
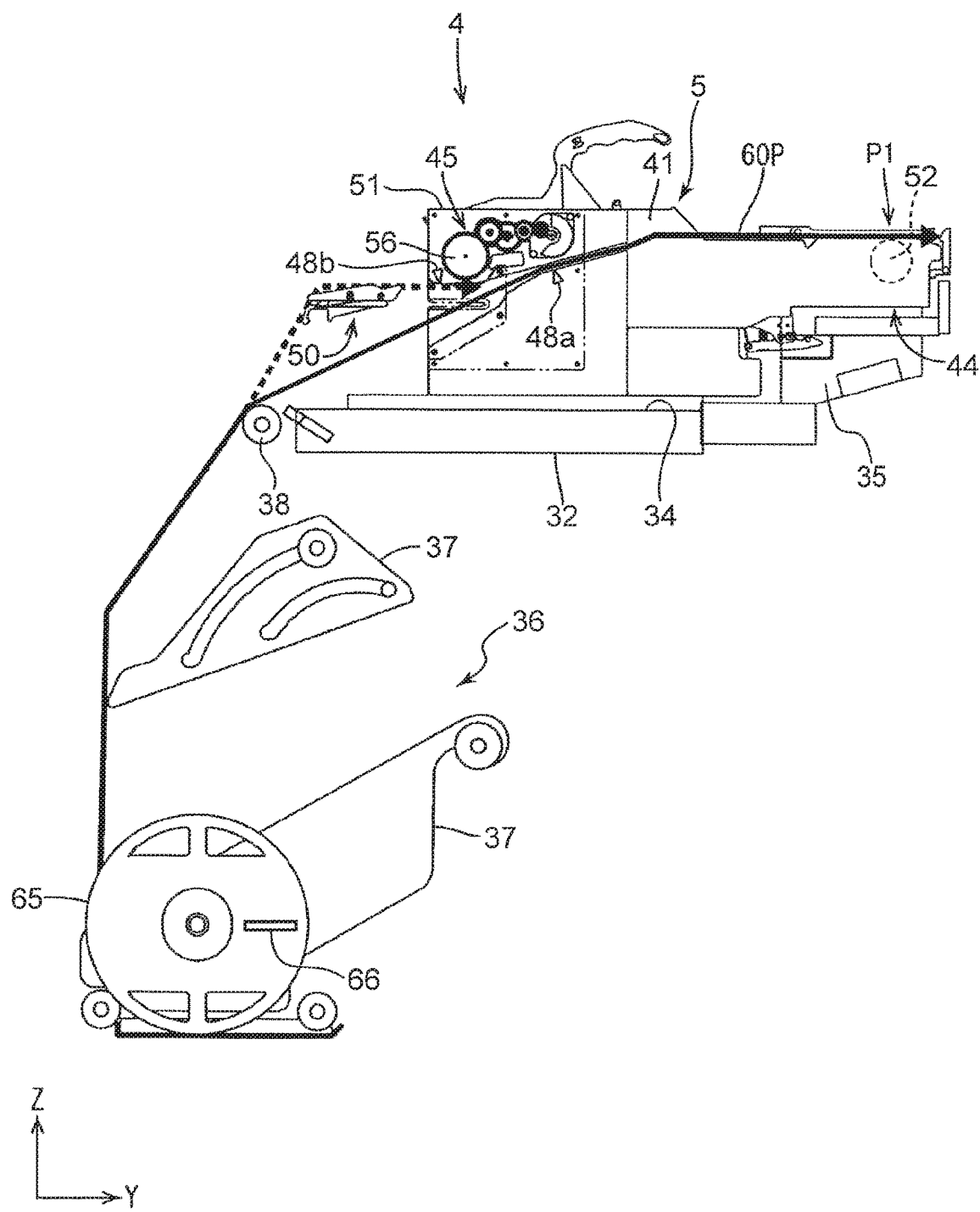
FIG. 5 is an explanatory view of a method of mounting a succeeding tape.

Firstly, an operator removes the tape support member 50 from the feeder body portion 41. When the tape support member 50 is removed, as shown in FIG. 5, the preceding part supply tape 60P is displaced to a bottom surface portion of the tape path 46 due to its own weight. Accordingly, the preceding part supply tape 60P is separated from the rear side sprocket 56 and hence, the engagement between the preceding part supply tape 60 and the rear side sprocket 56 is released.

Figure 6:
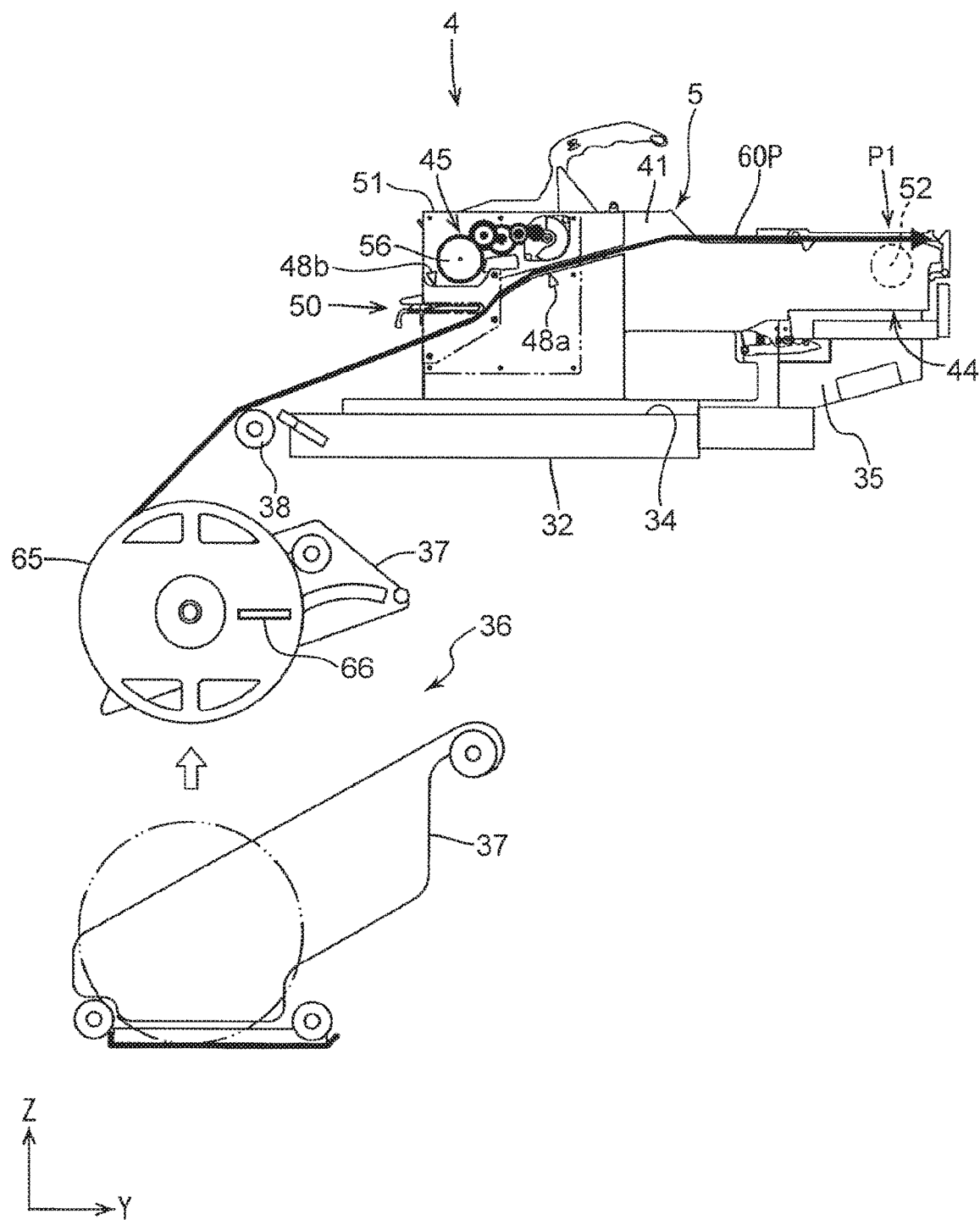
FIG. 6 is an explanatory view of the method of mounting a succeeding tape.

Next, the operator mounts the tape support member 50 on the feeder body portion 41, and as shown in FIG. 6, the reel 65 around which the preceding part supply tape 60P is wound is transferred from the reel holder 37 on a lower stage to the reel holder 37 on an upper stage.

Figure 7:
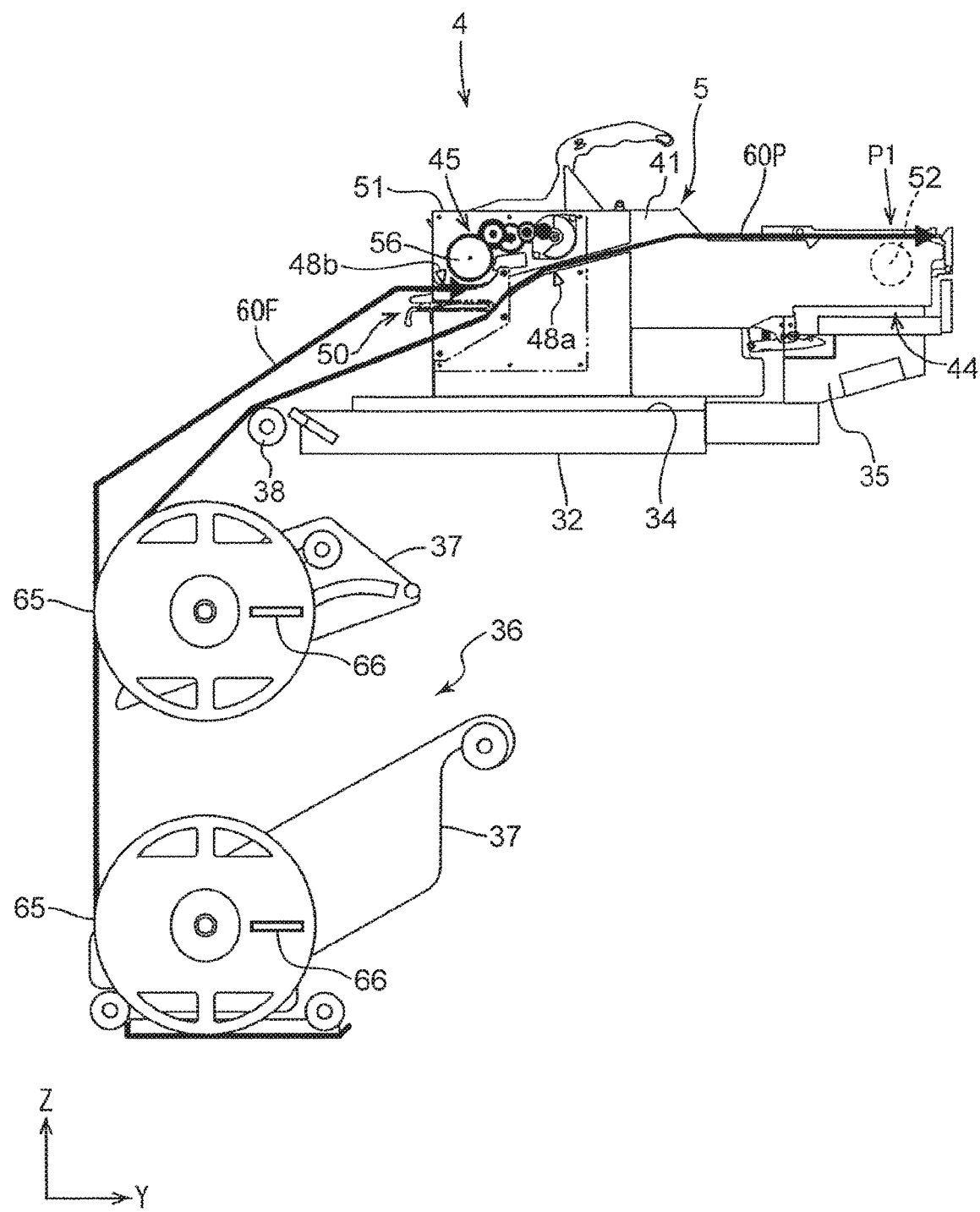
FIG. 7 is an explanatory view of the method of mounting the succeeding tape.

Then, as shown in FIG. 7, the reel 65 around which the succeeding part supply tape 60F is wound is mounted on the reel holder 37 on a lower stage, the part supply tape 60F is reeled out from the reel 65, and the distal end portion of the part supply tape 60F is set on the upper side path 46a from behind the feeder body portion 41. That is, the distal end portion of the part supply tape 60F is inserted into the upper side path 46a, and the distal end portion is supported on the support lug 50a in a state where the distal end portion is made to engage with the rear side sprocket 56. With such an operation, mounting of the succeeding part supply tape 60F on the tape feeder 5 is completed. Also setting the succeeding part supply tape 60F, in the same manner as the case of the preceding part supply tape 60P, for verification of a part, a barcode 66 (part ID) described later which is laminated to the reel 65 is read using the barcode reader 84 described later.

Mounting of the succeeding part supply tape 60F on the tape feeder 5 does not obstruct feeding of the preceding part supply tape 60P at all. Accordingly, mounting of the succeeding part supply tape 60F on the tape feeder 5 can be performed without any trouble in a state where the preceding part supply tape 60P is being mounted on the tape feeder 5.

Figure 8:
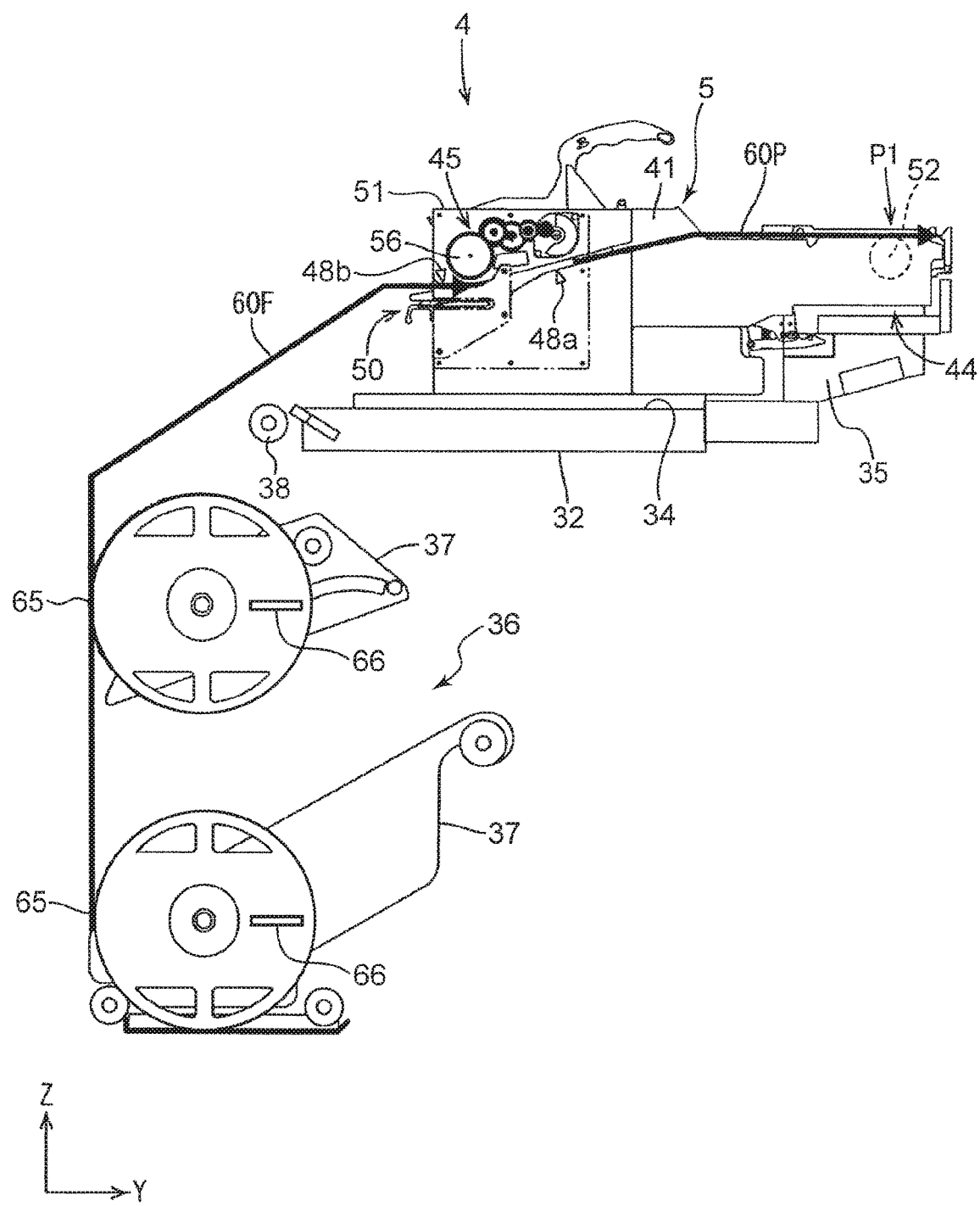
FIG. 8 is an explanatory view of the method of mounting a succeeding tape.

Assume a case where, in a part mounting operation, the preceding part supply tape 60P is entirely reeled out from the reel 65 and, as shown in FIG. 8, a tail end of the preceding part supply tape 60P passes the position of the first tape detection sensor 48a, and the absence of the preceding part supply tape 60P is detected. In this case, the rear side motor 57 is driven by the feeder control part 49 so that the succeeding part supply tape 60F is loaded to the part supply position P1. That is, the rear side sprocket 56 is rotated, and along with such rotation of the rear side sprocket 56, the succeeding part supply tape 60F is fed to the position where the part supply tape 60F engages with the front side sprocket 52. With such an operation, the transfer from the preceding part supply tape 60P to the succeeding part supply tape 60F is automatically performed.

After such operations are completed, the reel 65 is removed from the reel holder 37 at an upper stage, and using the current part supply tape 60F as the preceding part supply tape 60P, the succeeding part supply tape 60F is mounted on the tape feeder 5 in accordance with the steps described above. Accordingly, the supply of parts by the tape feeder 5 can be successively and continuously performed.

[Control System of Part Mounting Device 1]

Next, a control system of the part mounting device 1 is described with reference to a block diagram shown in FIG. 9.

Figure 9:
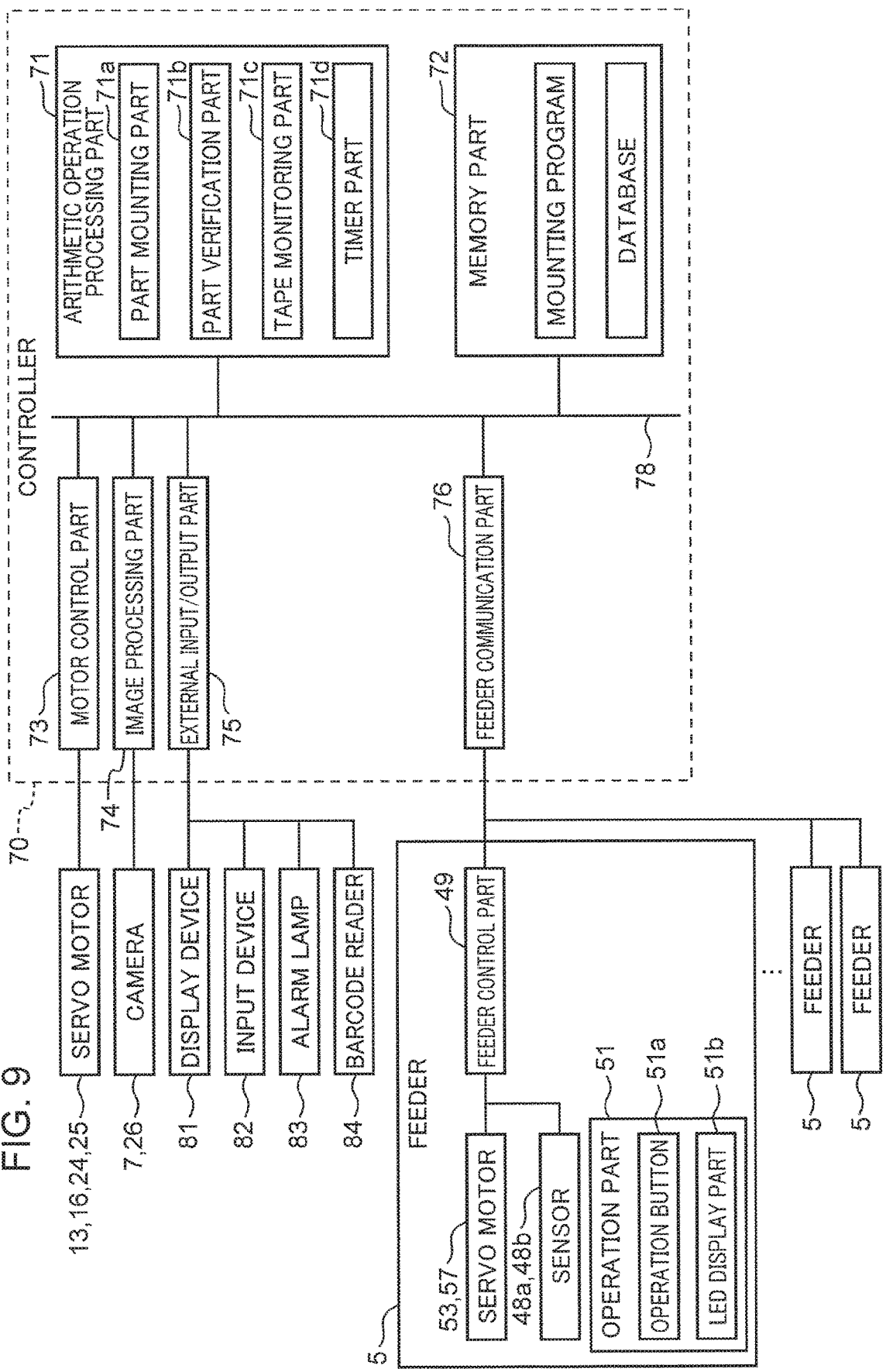
FIG. 9 is a block diagram showing the configuration of a control system of the part mounting device.

The part mounting device 1 includes the controller 70 as shown in FIG. 9. The controller 70 includes: an arithmetic operation processing part 71 which integrally controls an operation of the part mounting device 1; a memory part 72 in which a mounting program and the like are stored; a motor control part 73 which controls driving of the respective servo motors 13, 16, 24, and 25 about X, Y, Z, and R axes; an image processing part 74 which applies predetermined processing to image data output from the part recognition cameras 7 and the substrate recognition camera 26; an external input/output part 75; and a feeder communication part 76.

The arithmetic operation processing part 71 is a computer formed of a CPU and a memory, and is connected to the memory part 72, the motor control part 73, the image processing part 74, the external input/output part 75 and the feeder communication part 76 via a bus 78.

The arithmetic operation processing part 71 includes a part mounting part 71a, a part verification part 71b, a tape monitoring part 71c, and a timer part 71d. The part mounting part 71a performs predetermined part mounting processing, and performs various arithmetic operation processing associated with the part mounting processing. The part verification part 71b performs predetermined part verification processing when a part ID (identification information of a part) is read using the barcode reader 84 described later. The tape monitoring part 71c performs tape monitoring processing for monitoring whether or not the part supply tape 60 is mounted on the tape feeder 5. The timer part 71d counts a predetermined set time in the above-mentioned part verification processing. Part verification processing and tape monitoring processing are described in detail later.

The memory part 72 stores respective databases which record a mounting program and data necessary for executing the mounting program. The databases also store various data necessary for the above-mentioned part verification processing. Specifically, as conceptually described in FIG. 10, the databases stores part verification data (corresponding to "part verification information" of the present disclosure) which make the set positions (set position information) of the respective tape feeders 5 in the part supply unit 4, that is, the positions of the slots 34 in the feeder mounting part 32 and identification information (part ID) of the parts disposed at the positions correlate with each other. Slot numbers which differ from each other are allocated to the respective slots 34, and the position of the respective slots 34, that is, the set positions of the tape feeder 5 are identified by these slot numbers. Part verification data also includes information on names, kinds, manufacturing lots of parts corresponding to part ID. The head unit 6 is controlled such that, based on part verification data shown in FIG. 10, parts are taken out from the tape feeder 5 at the set position where the tape feeder 5 which supplies parts of desired part ID is set.

The feeder communication part 76 is a feeder dedicated interface, and all tape feeders 5 disposed in the part supply unit 4 are connected to the feeder communication part 76 via the connector on the fixing base 35.

The external input/output part 75 is an interface for equipment other than the tape feeder. The external input/output part 75 is connected with a display device 81 such as a liquid crystal display device for displaying various information, an input device 82 such as a keyboard, an alarm lamp 83 which notifies an operator of the occurrence of abnormality in the part mounting device 1 or the tape feeder 5 when such abnormality occurs, the barcode reader 84, and the like. The display device 81 corresponds to a notification part of the present disclosure.

The barcode reader 84 is provided for reading a part identification barcode 66 (see FIG. 2/corresponding to a recording part of the present disclosure) attached to the reel 65 around which the part supply tape 60 is wound. The part identification barcode 66 (hereinafter, abbreviated as barcode 66) holds therein part IDs of parts accommodated in the part supply tape 60 which is wound around the reel 65 and other various information relating to the parts by encoding the part IDs and information. The barcode 66 is attached to a side surface of the reel, for example.

In this embodiment, the tape erroneous mounting detection system of the present disclosure includes the second tape detection sensor 48b of the tape feeder 5, the LED display part 51b, the barcode reader 84, the arithmetic operation processing part 71 (part verification part 71b, tape monitoring part 71c, timer part 71d), the memory part 72 and the like.

A part mounting operation of the part mounting device 1, based on a control of the arithmetic operation processing part 71 (part mounting part 71a) is performed as follows. Firstly, the head unit 6 moves on the part supply unit 4, and parts are taken out from the tape feeder 5 by the respective heads 20. Then, when the head unit 6 passes over the closest part recognition camera 7, the parts sucked by the respective heads 20 are imaged by the part recognition camera 7 so that the suction state of the parts is recognized. Then, the head unit 6 moves over the substrate P and the parts sucked by the respective heads 20 are sequentially mounted on the substrate P. At this stage of operation, the position of the head unit 6 and a rotational angle or the like of the heads 20 are controlled based on a result of part recognition so that the parts are properly mounted on respective mounting points of the substrate P. With such an operation, one cycle of the mounting operation is finished, and the desired parts are mounted on the substrate P by repeating such an operation as necessary.

[Various Processing Controls by Arithmetic Operation Processing Part 71]

The tape feeder 5 mounted on the part mounting device 1 is a tape feeder of the splicing-less method as described previously. This tape feeder 5 has an advantage that, by setting the part supply tape 60 in advance, a tape feeding operation is automatically started along with starting of a part mounting operation, and with respect to the succeeding part supply tape 60, parts can be supplied continuously without performing a tape joining operation. However, when a correspondence relationship between the tape feeder 5 (set position) and the part is not appropriate, there is a concern that a defect in supplying parts or a failure is induced in the tape feeder 5, or an erroneous part is mounted on the substrate P. Accordingly, in this part mounting device 1, to avoid such a trouble, tape monitoring processing for monitoring whether or not the part supply tape 60 is mounted on the tape feeder 5 is performed, and part verification processing is performed along with mounting of the part supply tape 60 on the tape feeder 5. The part verification processing is processing which requests an operator to perform a reading operation of the barcode 66 (part ID) using the barcode reader 84, and determines whether or not the correspondence relation between the tape feeder 5 (set position) and the part is appropriated based on the read part ID. Tape monitoring processing is performed by the tape monitoring part 71c, and part verification processing is performed by the part verification part 71b. Hereinafter, these pieces of processing are described in detail.

The arithmetic operation processing part 71, as a result of part verification processing, outputs a control signal to the feeder control part 49 so as to allow loading of the part supply tape 60 only when the tape feeder 5 (set position information of the tape feeder 5) and the part ID are compatible with each other. That is, the arithmetic operation processing part 71 inhibits loading of the part supply tape 60 when the tape feeder 5 and the part ID are not compatible with each other. Accordingly, in the case where the tape feeder 5 and the part ID are not compatible with each other, even when the part supply tape 60 is loaded on the tape feeder 5 and the operation button 51a is operated, loading of the part supply tape 60 is not performed. Further, with respect to the succeeding part supply tape 60, even in the case where the entire preceding part supply tape 60 is fed out (even when the tail end of the part supply tape 60 passes the position of the first tape detection sensor 48a and the absence of the preceding part supply tape 60 is detected), loading of the succeeding part supply tape 60 is not performed.

1. Tape Monitoring Processing

Figure 11:
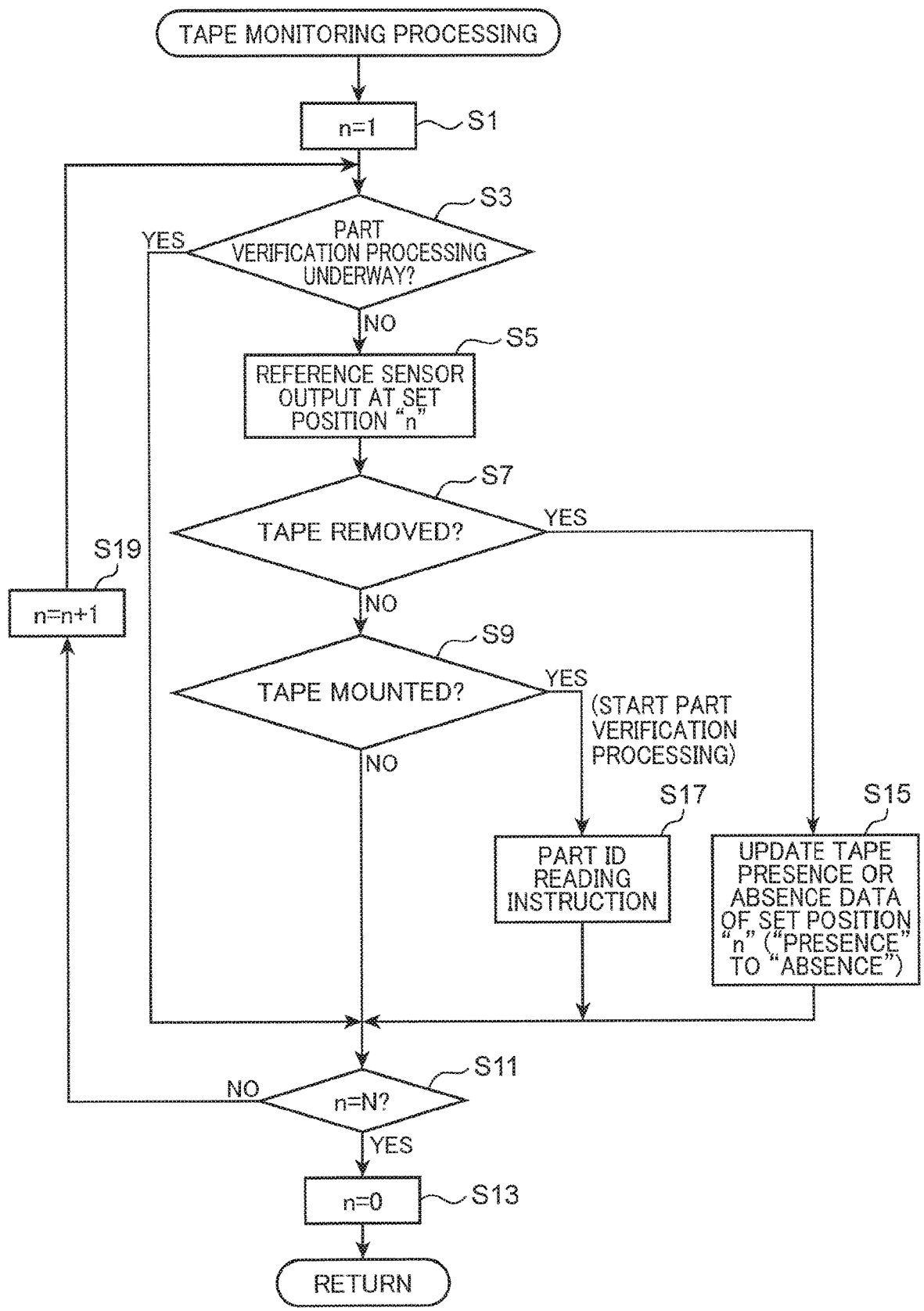
FIG. 11 is a flowchart showing tape monitoring processing.

FIG. 11 is a flowchart showing tape monitoring processing.

Tape monitoring processing is continuously performed from a point of time that the part mounting device 1 starts, for example. When tape monitoring processing starts, the tape monitoring part 71c sets an initial value "1" at a counter value of the set position counter (step S1). The tape monitoring part 71c determines whether or not part verification processing is underway with respect to any one of the tape feeders 5, that is, the tape monitoring part 71c determines whether or not a part verification processing flag described later (step S21 shown in FIG. 12) is set (step S13).

In step S3, if the determination result is No, the tape monitoring part 71c determines whether or not the tape 60 is removed from the tape feeder 5 (step S7) by referencing an output signal of the second tape detection sensor 48b at the set position corresponding to a counter value "n", that is, the output signal of the second tape detection sensor 48b of the tape feeder 5 set in the slot 34 having the slot number "n" (step S5). In this example, for example, a signal from the second tape detection sensor 48b is output to the controller 70 via the feeder control part 49. In such an operation, a signal of level "0" is output to the controller 70 when the tape 60 is not present, and a signal of level "1" is output to the controller 70 when the tape 60 is present. Accordingly, the part verification part 71b determines the presence or absence of the tape 60 based on the signal level and, then, the part verification part 71b determines whether or not the tape 60 is removed based on such a result and tape presence or absence data (corresponding to "tape presence or absence information" of the present disclosure).

Tape presence or absence data is data indicative of presence or absence of the tape 60 at each set position, and is stored in the database in an updated manner. That is, the tape monitoring part 71c determines that the tape 60 is removed when data of set position "n" is "presence" and signal level from the second tape detection sensor 48b is "0" in the tape presence or absence data. Accordingly, tape monitoring part 71c determines that the tape 60 is removed not only the case where the tape 60 is pulled out (taken out) from the upper side path 46a but also in the case where the preceding tape 60F is transferred from the upper side path 46a to the lower side path 46b due to the insertion and removal of the support member 50 so that a signal level from the second tape detection sensor 48b becomes "0".

If the determination result is Yes in step S7, the tape monitoring part 71c changes data of the set position "n" from "presence" to "absence" in tape presence or absence data, stores the tape presence or absence data in an updating manner (step S15) and, thereafter, advances processing to step S11.

On the other hand, if the determination result is No in step S7, the tape monitoring part 71c determines whether or not the tape 60 is mounted on the tape feeder 5 at the set position "n" (step S9). Specifically, when data of the set position "n" is "absence" and a signal level from the second tape detection sensor 48*b* is "1" in tape presence or absence data, the tape monitoring part 71*c* determines that the tape 60 is mounted.

If the determination result is No in step S9, the tape monitoring part 71*c* advances processing to step S11. On the other hand, if determination result is Yes in step S9, the tape monitoring part 71*c* instructs an operator to read the part ID (barcode 66). For example, the tape monitoring part 71*c* controls the display device 81 so as to make the display device 81 display information by which the set position of the tape feeder 5 on which the tape 60 is mounted can be identified and a message which requests reading of the part ID using the barcode reader 84.

Then, the tape monitoring part 71*c* advances processing to step S11. If the determination result is Yes in step S3, that is, the part verification processing is underway with respect to any one of the tape feeders 5, the tape monitoring part 71*c* advances the processing to step S11 by skipping processing in steps S3 to S9 and processing in steps S15 and S17.

In step S11, the tape monitoring part 71*c* determines whether or not a counter value of the set position counter is equal to the total number N of the set positions. If the determination result is No in step S11, a counter value is inclement by "1" and the tape monitoring part 71*c* advances processing to step S3 (step S19). On the other hand, if the determination result is Yes in step S11, the counter value is reset to "0" (step S13), and thereafter, the tape monitoring part 71*c* returns processing to step S1.

In this manner, during a period which differs from a period during which part verification processing is performed, the tape monitoring part 71*c* monitors whether or not the tape 60 is mounted on each tape feeder 5 based on a signal output from the second tape detection sensor 48*b* and tape presence or absence data. When the tape 60 is mounted, the tape monitoring part 71*c* makes the display device 81 display a message or the like which requests reading of the part ID using the barcode reader 84. That is, in this embodiment, the above-mentioned tape monitoring processing performed during the period which differs from the period during which part verification processing is performed corresponds to "tape detection processing" of the present disclosure.

2. Part Verification Processing

Figure 12:
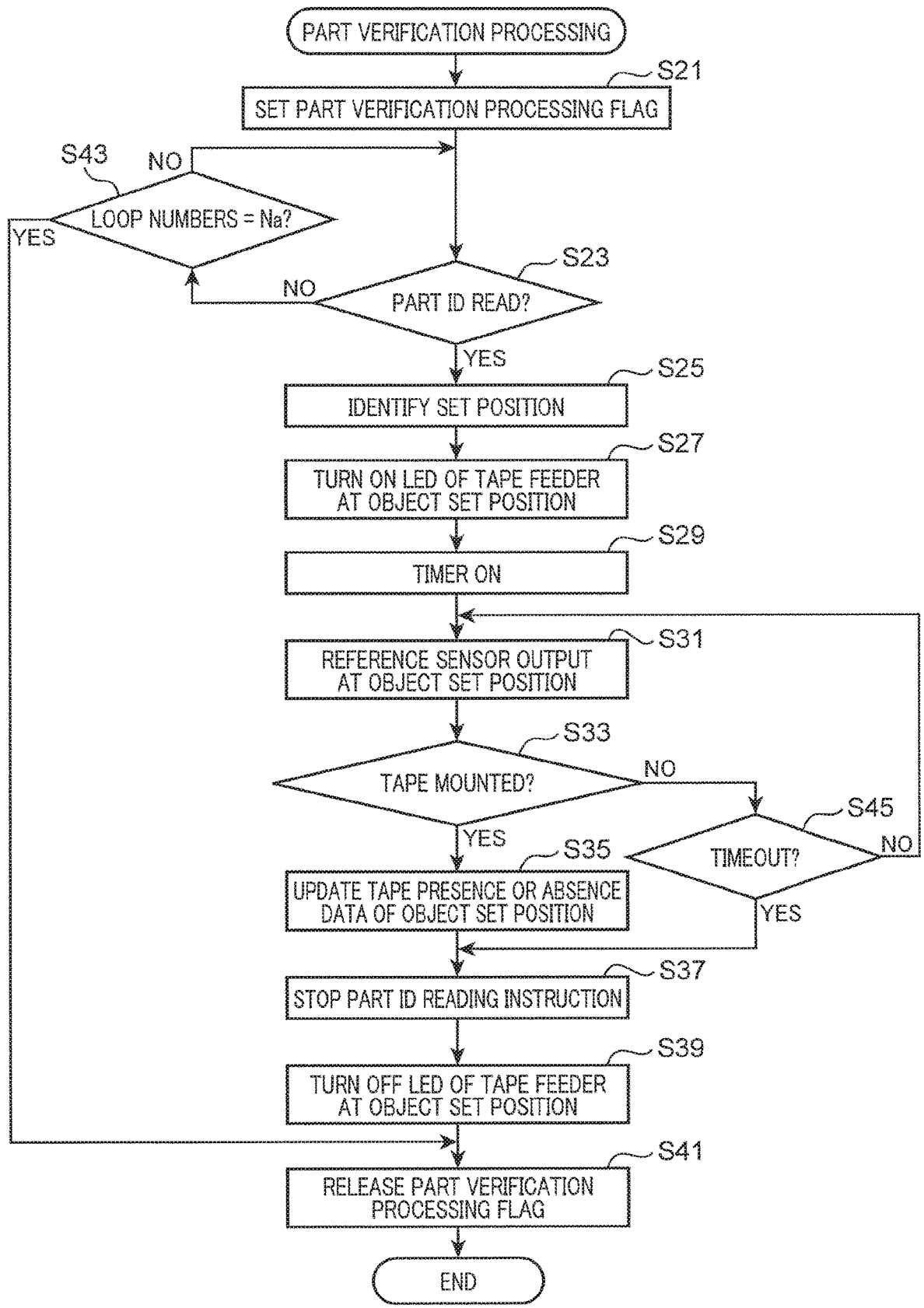
FIG. 12 is a flowchart showing part verification processing.

FIG. 12 is a flowchart showing part verification processing.

Part verification processing starts at a point of time that the determination is made that the tape 60 is mounted on the tape feeder 5 in the above-mentioned tape monitoring processing (Yes in step S9 shown in FIG. 11).

When part verification processing starts, the part verification part 71*b* sets a part verification processing flag (step S21), and waits until the part ID (barcode 66) is read in accordance with a message displayed on the display device 81 (step S17 shown in FIG. 11) (step S23).

When the part ID is read (Yes in step S23), the part verification part 71*b* identifies the set position of the tape feeder 5 on which the part corresponding to the part ID to be mounted, that is, the slot number based on the part ID and the part verification data of database (see FIG. 10). Further, the part verification part 71*b* makes the LED display part 51*b* of the tape feeder 5 turn on (or flicker) by outputting a control signal to the tape feeder 5 set at the set position (hereinafter referred to as object set position) (hereinafter referred to as object feeder 5) (steps S25, S27). Then, the part verification part 71*b* operates the timer part 71*d* (step S29). By turning on the LED display part 51*b* of the object tape feeder 5 in this manner, it is possible to make an operator recognize a correspondence relationship between the tape 60 which the operator mounts and the set position (tape feeder 5) at which the tape 60 is to be mounted.

The timer part 71*d* counts a predetermined set time. The set time is set to a time (approximately 30 seconds) which allows an operator to mount the tape 60 on the tape feeder 5 after the LED display part 51*b* is turned on, and further, to allow the operator to remount the mounted tape 60 on the tape feeder 5 immediately one time or plural times.

Next, the part verification part 71*b* determines whether or not the tape 60 is actually mounted on the object feeder 5 (step S33) by referencing an output signal from the second tape detection sensor 48*b* of the object feeder 5 (step S31).

If the determination result is Yes in step S33, the part verification part 71*b* changes data on the tape 60 at the object set position from "absence" to "presence" in tape presence or absence data, and stores the tape presence or absence data in an updated manner (step S35).

If the determination result is Yes in step S33, it is confirmed by the part verification part 71*b* that the part verification is performed correctly, that is, the tape 60 which supplies a part having a desired part ID is set at the correct set position. The part verification part 71*b* stores this information in the memory part 72, and performs loading of the tape 60 when a command of loading the tape 60 is generated in response to the detection of part running out of the preceding tape 60 or an operation of the operation button 51*a*.

Then, the part verification part 71*b* turns off the LED display part 51*b* by outputting the control signal to the object feeder 5 and, at the same time, stops a display of a message by the display device 81 (stops a part ID reading instruction). Further, the part verification part 71*b* releases a part verification processing flag (steps S37 to S41) and, thereafter, finishes part verification processing.

On the other hand, if the determination result is No in step S33, that is, if it is determined that the tape 60 is not mounted on the object feeder 5, the part verification part 71*b* determines whether or not a timeout comes, that is, whether or not counting of the above-mentioned set time by the timer part 71*d* is completed (step S45). In step S45, if the determination result is No, the part verification part 71*b* advances processing to step S31, while if the determination result is Yes, the part verification part 71*b* advances processing to step S37.

That is, even in the case where the tape 60 is not mounted at the object set position (object feeder 5) identified in step S25, when the tape 60 is remounted on the object feeder 5 within the above-mentioned set time, the part verification part 71*b* updates tape presence or absence data of the object set position and, thereafter, releases the part verification processing flag. On the other hand, when the tape 60 is not remounted on the object feeder 5 within the above-mentioned set time, the part verification part 71*b* skips step S35. Accordingly, the part verification part 71*b* does not update tape presence or absence data of the object set position, turns off the LED display part 51*b* and, at the same time, stops a display of a message by the display device 81, and releases the part verification processing flag.

If the part verification part 71*b* determines that reading of a part ID is not performed within a period where determination processing in step S23 is performed by processing loop number Na after the part verification processing flag is set in step S21 (Yes in step S43), the part verification part 71*b* skips processing in steps S23 to S39, advances processing to step S41, and releases the part verification processing flag.

In this embodiment, processing mainly in steps S31 to S35 in part verification processing corresponds to "verification updating processing" of the present disclosure.

[Functions and Effects]

In the part mounting device 1, when an operator mounts the tape 60 on any one of tape feeders 5, a message which requests reading of a part ID (barcode 66) using the barcode reader 84 is displayed by the display device 81. Accordingly, the operator is requested to read the part ID on the tape 60.

When reading of the part ID is properly performed, the LED display part 51b of the object feeder 5 corresponding to the tape 60 is turned on (step S27 shown in FIG. 12).

At this stage of the operation, when a correspondence relationship between the tape 60 and the set position of the tape feeder 5 on which the tape 60 is actually mounted is correct, that is, when the tape 60 is mounted on the object feeder 5, data of the object set position in tape presence or absence data is updated. Immediately after such data is updated, the LED display part 51b is turned off and, at the same time, a display of a message by the display device 81 is stopped (steps S35 to S39 shown in FIG. 12). Accordingly, the operator can recognize that the tape 60 is properly mounted on the object feeder 5.

On the other hand, when the correspondence relationship between the tape 60 and the set position of the tape feeder 5 on which the tape 60 is actually mounted is incorrect, in other words, when the tape 60 is mounted on the tape feeder 5 which is not the object feeder 5, the LED display part 51b is continuously turned on, and a display of a message by the display device 81 is also maintained during a period until the above-mentioned set time elapses (Yes in step S45). Accordingly, the operator can recognize that the tape 60 is not mounted on the object feeder 5.

In this case, when the tape 60 is remounted on the object feeder 5 within the above-mentioned set time, the tape presence or absence data is updated, the LED display part 51b is turned off and, at the same time, a display of a message by the display device 81 is stopped (steps S35 to S39 shown in FIG. 11). Accordingly, the operator can recognize that the tape 60 is properly remounted on the object feeder 5.

When reading of the part ID (barcode 66) using the barcode reader 84 is not performed (Yes in step S43 shown in FIG. 12) or when the tape 60 is mounted on the tape feeder 5 which is not the object feeder 5 and the tape 60 is not remounted on the object feeder 5 within the above-mentioned set time, tape presence or absence data is not updated and the part verification processing flag is released (step S41 shown in FIG. 12). Accordingly, in tape monitoring processing, again, it is determined that the tape 60 is mounted on the tape feeder 5 (Yes in step S9 shown in FIG. 11), a message which requests reading of the part ID using the barcode reader 84 is displayed (step S17 shown in FIG. 11), and part verification processing is performed.

As has been described above, according to the part mounting device 1, when the tape 60 is mounted on the tape feeder 5, in response to such mounting, a message which requests reading of a part ID (barcode 66) using the barcode reader 84 is displayed, and part verification processing is performed. Accordingly, it is possible to suppress the occurrence of a drawback that the tape 60 mounted on the tape feeder 5 is left in a state where reading of a part ID is not performed using the barcode reader 84, the tape 60 is mounted on the tape feeder 5 on a trial basis, and such a mounting state of the tape 60 is forgotten and is left as it is, and eventually, it is possible to suppress the occurrence of a trouble such as a defect in supplying parts on the tape feeder 5 attributed to the fact that the above-mentioned state is left.

In the above-mentioned part verification processing, even when the tape 60 is mounted on the tape feeder 5 which is not an object on which the tape 60 is to be mounted, a part verification processing flag is not released until a set time is counted by the timer part 71d (steps S33, S45 shown in FIG. 12). Accordingly, an operator can remount the tape 60 during the set time and hence, it is also possible to acquire an advantageous effect that the part verification processing can be set free from cumbersomeness that a reading operation of an ID (barcode 66) is repeated.

That is, if the determination result is No in step S33 shown in FIG. 12, it may be considered that processing immediately advances to step S41 and a part verification processing flag is released (part verification processing is finished). However, in this case, to acquire the determination result of Yes in step S33, it is necessary for an operator to remount the tape 60 on the object feeder 5 and to read a part ID using the barcode reader 84 again. Accordingly, when the tape 60 is mounted on the tape feeder 5 which is not an object, it is always necessary for an operator to perform a reading operation of a part ID using the barcode reader 84 twice or more, and such an operation is cumbersome.

In this respect, according to the above-mentioned part mounting device 1, provided that the tape 60 is set on the object feeder 5 until the completion of counting of a set time by the timer part 71d after the LED display part 51b of the object feeder 5 is turned on, tape presence or absence data is updated before part verification processing is finished. Accordingly, even when the tape 60 is mounted on the tape feeder 5 which is not an object, when an operator remounts the tape 60 within the above-mentioned set time, it is unnecessary to read a part ID using the barcode reader 84 again. Accordingly, with the use of the part mounting device 1, the above-mentioned cumbersomeness can be eliminated.

Particularly, the above-mentioned set time is set to a time (approximately 30 seconds) which allows an operator to mount the tape 60 on the tape feeder 5 and to immediately remount the mounted tape 60 one time or plural times. Accordingly, it is possible to acquire an advantageous effect that an operator can have enough time to accurately and surely remount the tape 60 on the object feeder 5.

[Modification of Part Verification Processing]

Next, a modification of part verification processing is described.

Figure 13:
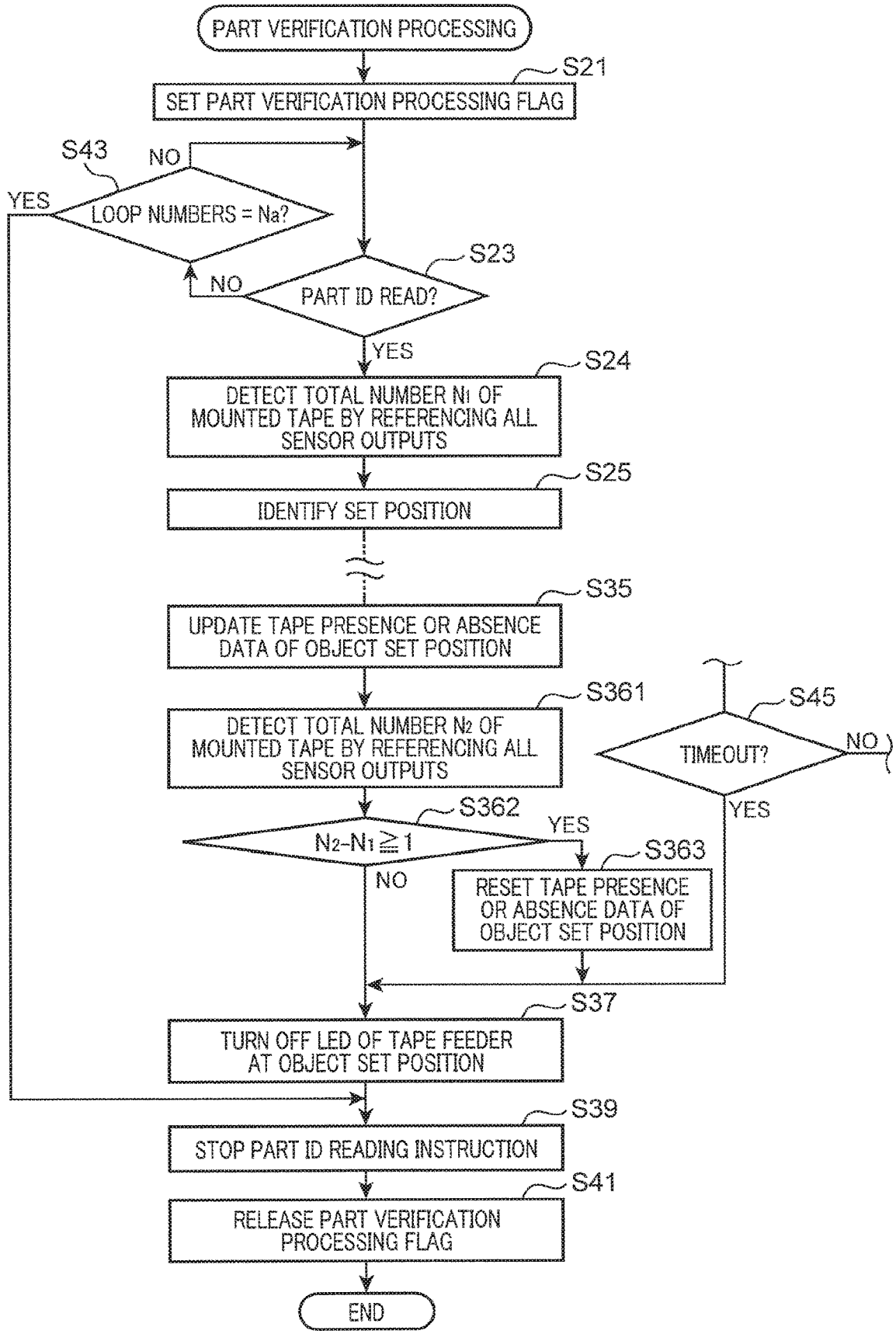
FIG. 13 is a flowchart showing a modification of part verification processing.

FIG. 13 is a flowchart showing a modification of part verification processing. Part verification processing shown in FIG. 13 is provided for overcoming one drawback of part verification processing shown in FIG. 12.

Specifically, part verification processing shown in FIG. 13 is provided for overcoming the drawback that, when one or a plurality of tapes 60 are successively mounted on the tape feeder 5 before a timeout (step S45 in FIG. 12) after the tape 60 whose part ID (barcode 66) is read is mounted on the tape feeder 5, there is a concern that erroneous mounting of the tape 60 is missed. This drawback is specifically described using FIG. 14 to FIG. 17 hereinafter.

FIG. 14 to FIG. 17 are timing charts showing output signals from the second tape detection sensors 48b of the respective tape feeders 5 set at the set position "Sp1" to "Sp6". A point of time ts is a point of time at which mounting of the tape 60 on the tape feeder 5 is detected (Yes in step S9 shown in FIG. 11). The tape 60 mounted at the point of time ts is referred to as the object tape 60. A point of time t1 is a point of time at which a part ID (barcode 66) of the object tape 60 is read using the barcode reader 84, and the object set position of the object tape 60 is identified based on the part ID (step S25 shown in FIG. 12). Points of time t2, t3 are points of time at which second and third tapes 60, that is, the tapes 60 which are not the object tape 60 are mounted respectively. A point of time to is a point of time of timeout (Yes in step S45 shown in FIG. 12). In all examples shown in FIG. 14 to FIG. 17, the object set position, that is, the set position which corresponds to the part ID of the object tape 60 is set as "Sp2" (indicated by a circle mark in the drawings).

Figure 14:
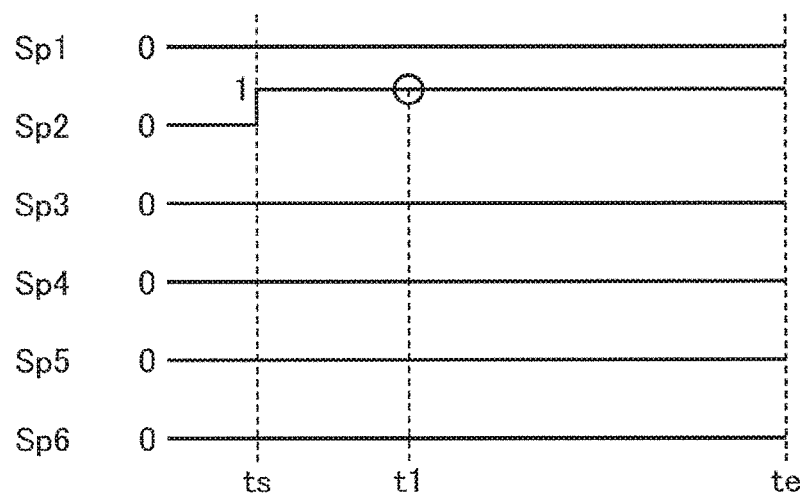
FIG. 14 is a timing chart showing outputs of tape detection sensors.
Figure 15:
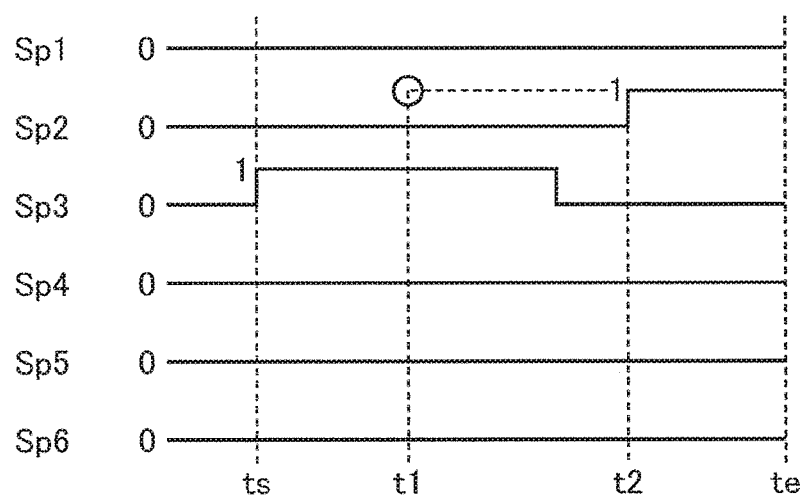
FIG. 15 is a timing chart showing outputs of the tape detection sensors.

FIG. 14 shows an example where the object tape 60 is mounted on the object feeder 5. FIG. 15 shows an example where although the object tape 60 is initially mounted on the tape feeder 5 which is not an object (tape feeder 5 at the set position "Sp3"), the object tape 60 is remounted at the object set position "Sp2" before a timeout. In both examples shown in FIG. 14 and FIG. 15, in part verification processing, it is determined that the object tape 60 is mounted on the object feeder 5 (Yes in step S33 shown in FIG. 12). Accordingly, no problem particularly arises.

Figure 16:
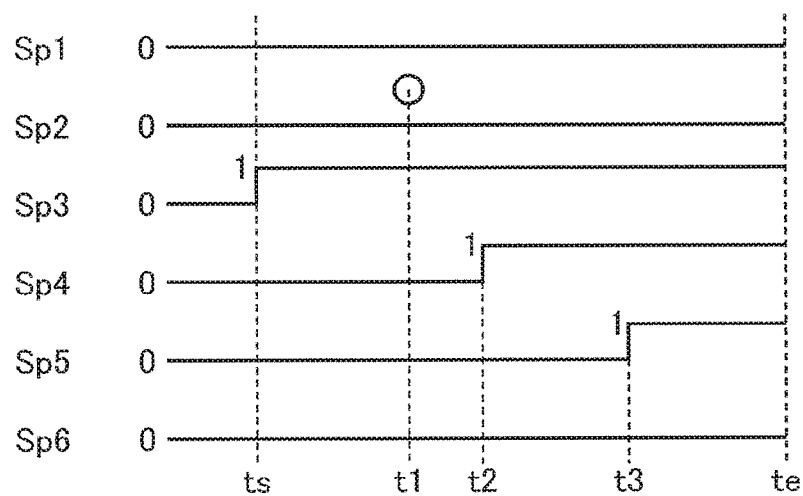
FIG. 16 is a timing chart showing outputs of the tape detection sensors.

FIG. 16 shows an example where the object tape 60 is mounted on the tape feeder 5 which is not the object (the tape feeder 5 at the set position "Sp3") and, thereafter, the tape 60 is mounted on the tape feeder 5 at the set positions "Sp4", "Sp5" which are different from the object set position "Sp2" of the object tape 60. In this case, the object tape 60 is not mounted on the object feeder 5 and hence, a timeout comes in a state where tape presence or absence data is updated at neither one of these set positions (Yes in step S45 shown in FIG. 12). Accordingly, all of the tapes 60 mounted on the tape feeders 5 at the set positions "Sp3" to "Sp5" are determined to be newly mounted in tape monitoring processing (Yes in step S9 shown in FIG. 11) and are subjected to the above-mentioned display of a message by the display device 81 and part verification processing. Accordingly, also in these cases, no problem particularly arises.

Figure 17:
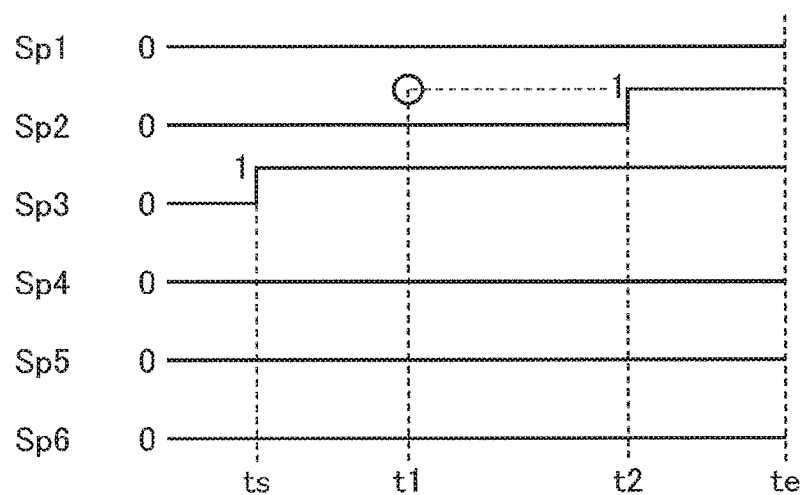
FIG. 17 is a timing chart showing outputs of the tape detection sensors.

On the other hand, FIG. 17 shows an example where the object tape 60 is mounted on the tape feeder 5 which is not an object (the tape feeder 5 at the set position "Sp3") and, thereafter, the second tape 60 is mounted on the tape feeder 5 at the set position "Sp2", that is, the object feeder 5 for the object tape 60 before a timeout.

In this case, the part verification part 71b simply determines whether or not the object tape 60 is mounted based on a signal level of the second tape detection sensor 48b of the object feeder 5. Accordingly, in the case shown in FIG. 17, the part verification part 71b determines that the object tape 60 is mounted on the object feeder 5 at the point of time t2 (steps S31 to S35 shown in FIG. 12). Accordingly, with respect to the set position "Sp3", it is determined that the object tape 60 is newly mounted in tape monitoring processing (Yes in step S9 in FIG. 11). As a result, there arises a state where although the set position "Sp3" is subjected to the above-mentioned display of a message by the display device 81 and part verification processing, the object tape 60 is not mounted at the set position "Sp2", that is, although the tape 60 which is not the object tape 60 is erroneously mounted, such erroneous mounting is not detected.

In this manner, part verification processing shown in FIG. 12 has a drawback that there is a possibility that erroneous mounting of the tape 60 in the example shown in FIG. 17 is missed.

The flowchart shown in FIG. 13 is provided for overcoming the drawback of part verification processing shown in FIG. 12.

The flowchart shown in FIG. 13 is a flowchart in which processing in step S24 is added to the flowchart of part verification processing shown in FIG. 11 and, further, processing in steps S361 to S363 are added between step S35 and step S37. Accordingly, in FIG. 13, most of steps which are also shared in common by FIG. 12 are omitted and only main parts are shown in the flowchart.

In part verification processing shown in FIG. 13, when the part verification part 71b determines that a part ID is read (Yes in step S23), the part verification part 71b detects the total number $N_1$ of the tapes 60 by referencing output signals from the second tape detection sensor 48b of all tape feeders 5 (step S24).

After updating tape presence or absence data (step S35), the part verification part 71b again detects the total number $N_2$ of the tapes 60 by referencing output signals from the second tape detection sensor 48b of all tape feeders 5 (step S361).

Then, the part verification part 71b determines whether or not a difference between the total number $N_2$ of the tapes 60 detected in step S361 and the total number $N_1$ of the tapes 60 detected in step S24 is 1 or more (step S362). If the determination result is No in step S362, the part verification part 71b advances processing to step S37. If the determination result is Yes in step S362, the part verification part 71b resets tape presence or absence data updated in step S35 to data before updating (step S363), and advances processing to step S37.

That is, even in the case where the tape 60 is mounted on the object feeder 5 (Yes in step S33), when the total number of tapes 60 mounted during a period until a timeout is increased by 1 or more (Yes in step S45 shown in FIG. 12), it is considered that a state described in the example shown in FIG. 17 has occurred.

In view of the above, when the total number of tapes 60 is increased by 1 or more, tape presence or absence data which was once updated is reset to data before updating (steps S362, S363). In this manner, when tape presence or absence data is reset to data before updating, it is determined that all of the object tape 60 and the tapes 60 mounted during part verification processing are newly mounted during tape monitoring processing (Yes in step S9 shown in FIG. 11), and these tapes 60 are subjected to the above-mentioned display of a message by the display device 81 and part verification processing. Accordingly, in response to such an operation, the tape 60 is remounted by an operator and hence, it is possible to suppress missing of erroneous mounting of the tape 60 in the example shown in FIG. 17.

In this embodiment, processing in step S24 corresponds to "first detection processing" of the present disclosure, and processing in step S361 corresponds to "second detection processing" of the present disclosure, and processing in steps S362, S363 correspond to "reset processing" of the present disclosure.

[Other Modifications]

The part mounting device 1 to which the present disclosure is applied has been described heretofore, the specific configuration of the present disclosure is not limited to the configuration of the above-mentioned embodiment, and can be suitably modified without departing from the gist of the present disclosure. For example, the present disclosure is also applicable to the following configurations.

Figure 18:
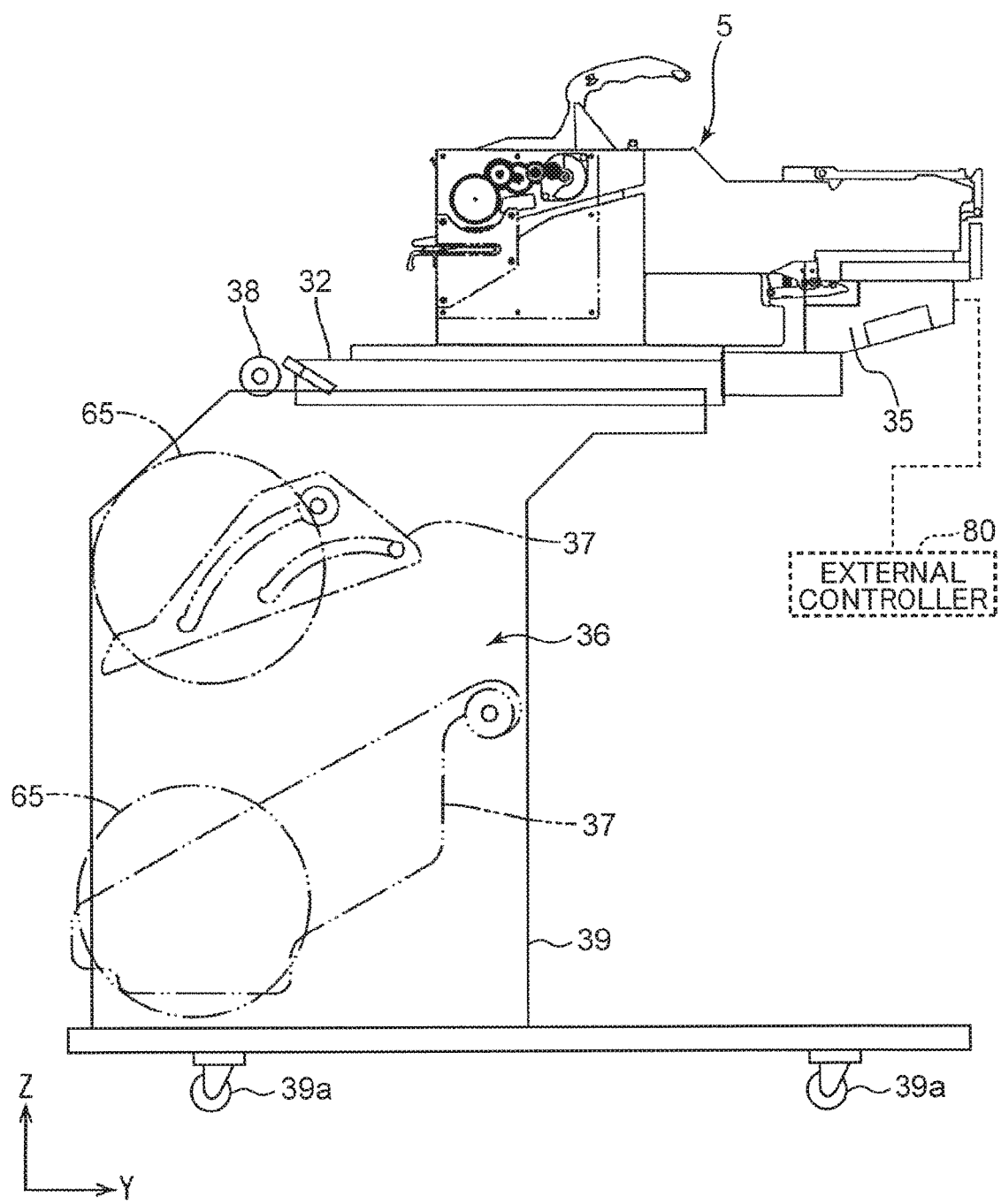
FIG. 18 is a schematic view showing a modification of the part supply unit as viewed in a side view.

(1) In the above-mentioned embodiment, the part supply unit 4 is integrally (non-detachably) incorporated in the part mounting device 1. However, the part supply unit 4 may be detachably merged with the device body of the part mounting device 1. Specifically, as shown in FIG. 18, the part supply unit 4 may include: the feeder mounting part 32; the fixing base 35; a unit frame 39 having the reel support portion 36 and the guide roller 38; and a plurality of casters 39a which movably support the unit frame 39, and the part supply unit 4 may be detachably configured with respect to the device body of the part mounting device 1 which includes the head unit 6 and the like. With such a configuration, the part supply unit 4 on which the tape feeder 5 is mounted as a preparation step is prepared in advance at a site away from the device body, and this part supply unit 4 is exchanged with the part supply unit 4 which is set on the device body previously and hence, a plurality of tape feeders 5 (parts) can be collectively exchanged. Accordingly, it is possible to acquire an advantageous effect that the part mounting device can quickly cope with changing of a type of a substrate to be manufactured.

In this case, an external controller 80 (see FIG. 18) and a barcode reader (not shown) which is capable of communicating with the external controller 80 are prepared in advance. The external controller 80 is a personal computer or the like in which a program and a database for performing the above-mentioned part verification processing and the above-mentioned tape monitoring processing are stored, and includes functions such as the above-mentioned part verification part 71b, tape monitoring part 71c, and the timer part 71d. Then, in mounting the tape feeder 5 on the part supply unit 4, the external controller 80 is communicably connected to the part supply unit 4, and the above-mentioned part verification processing and the above-mentioned tape monitoring processing are performed by the external controller 80. With such a configuration, even at a site remote from the device body, the above-mentioned tape monitoring processing and the above-mentioned part verification processing can be performed. Accordingly, in the same manner as the above-mentioned embodiment, the tape 60 can be properly mounted on each tape feeders 5.

When the personal computer is used as the external controller 80, in place of the above-mentioned display device 81, a message which requests reading of a part ID (barcode 66) using the barcode reader 84 may be displayed by a display screen.

Figure 19:
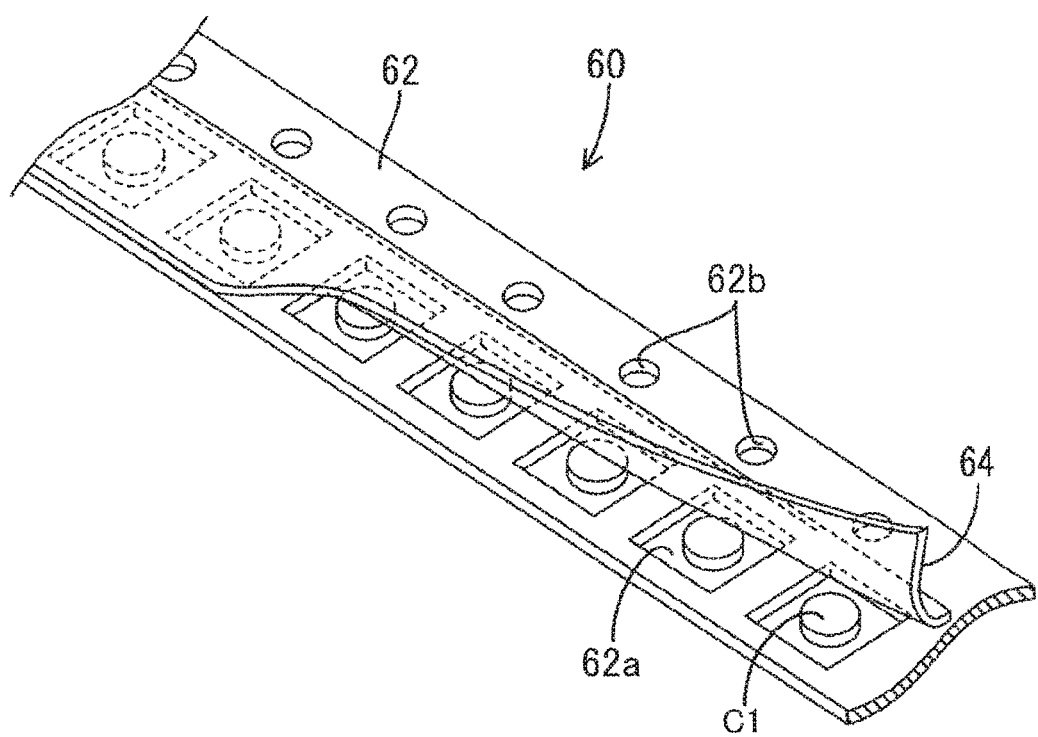
FIG. 19 is a perspective view of a part supply tape showing a modification of a cutting pattern of a cover tape.

(2) In the above-mentioned embodiment, as shown in FIG. 4, in the above-mentioned tape feeder 5, the parts Cl are exposed to the outside by cutting the cover tape 64 at the center in the width direction along the longitudinal direction and by folding the cover tape 64 to the outside. However, as shown in FIG. 19, a tape feeder 5 may be configured such that one end of the cover tape 64 in the width direction is peeled off along the longitudinal direction, and such one end of the cover tape 64 is folded toward the other end in the width direction. Further, a tape feeder 5 may be of a type where a cover tape 64 is wound while being peeled off from a tape body 62. Various types of tape feeders are applicable as the tape feeder 5.

(3) In the above-mentioned embodiment, the barcode 66 is mounted on the reel 65 as the recording part which records a part ID (identification information of a part). However, two dimensional code such as a QR code (registered trademark) besides the barcode 66, an IC chip or the like may be used as the recording part. Besides mounting the recording part on the reel 65, a recording part may be mounted on a part supply tape per se by printing a two dimensional code on a part supply tape 60.

Reference Example

Figure 20:
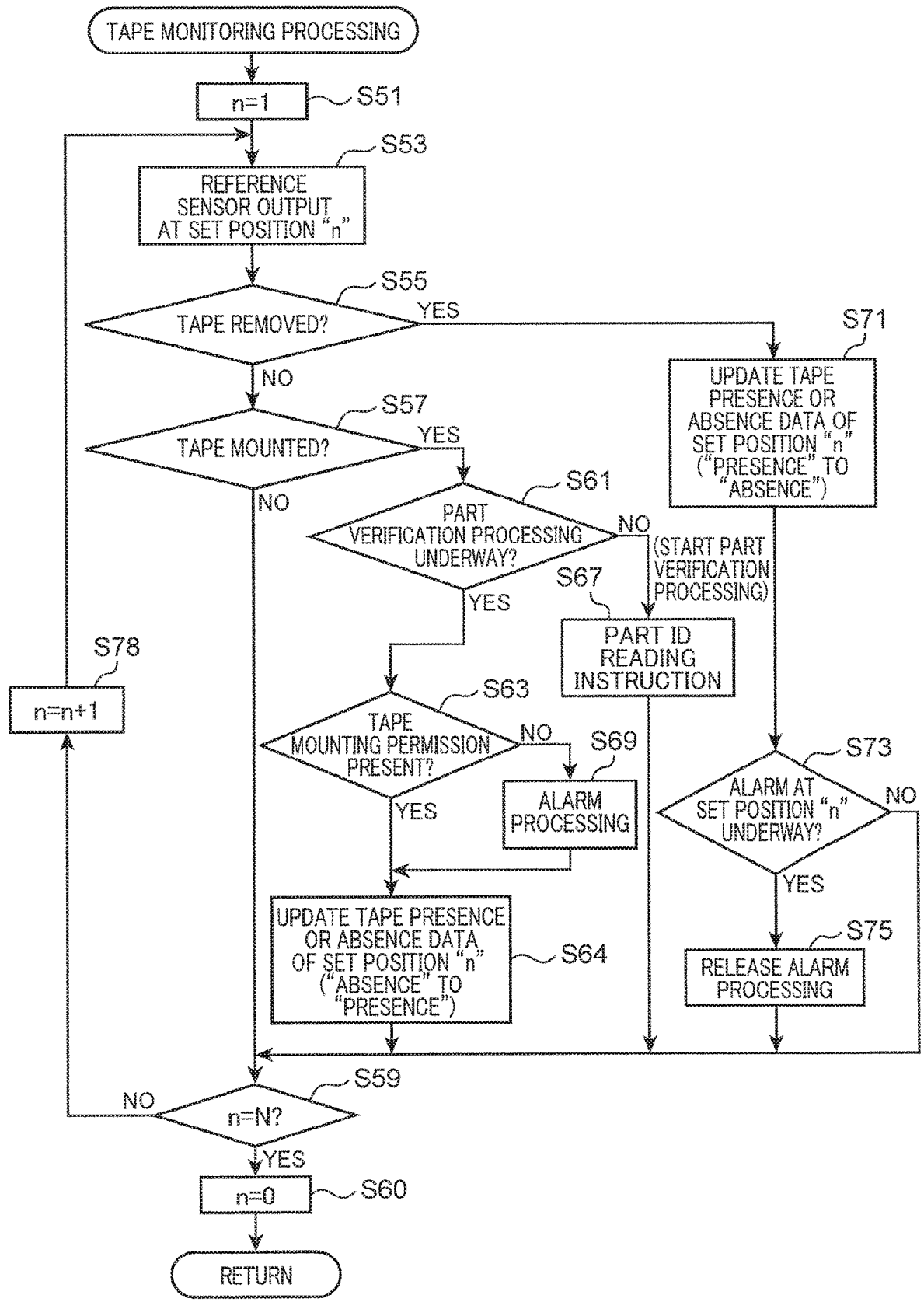
FIG. 20 is a flowchart showing a reference example of tape monitoring processing.
Figure 21:
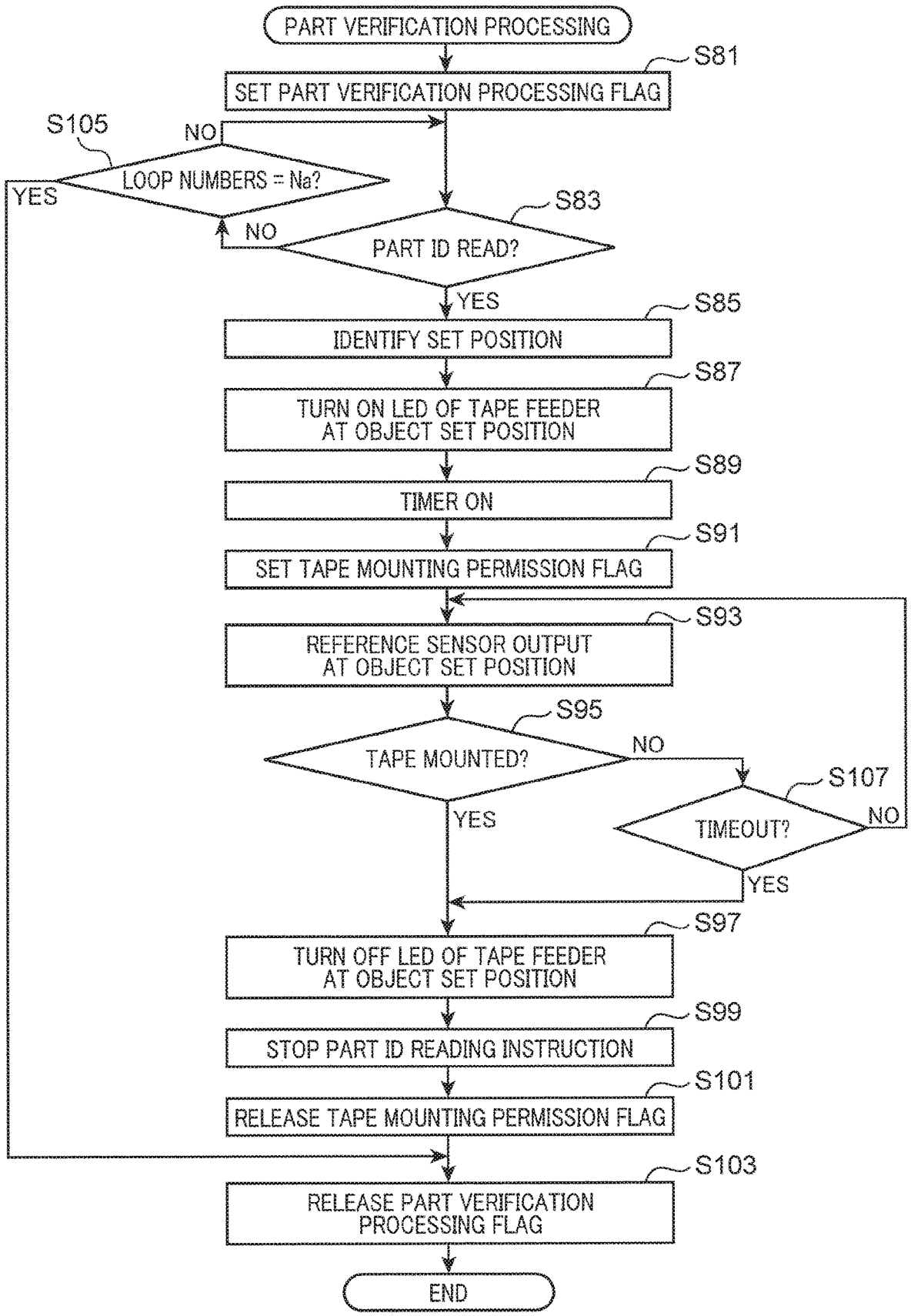
FIG. 21 is a flowchart showing reference example of part verification processing.

In part verification processing which the part verification part 71b performs and tape monitoring processing which the tape monitoring part 71c performs, besides the processing described in the flowcharts shown in FIG. 11 and FIG. 12, processing described in flowcharts shown in FIG. 20 and FIG. 21 are also applicable.

Although examples shown in FIG. 20 and FIG. 21 are modifications of the examples shown in FIG. 11 and FIG. 12, respectively, these modifications do not fall within the present disclosure with respect to points described later. However, these modifications can achieve the object to be solved in common with the present disclosure for suppressing the occurrence of a trouble caused by missing of reading of identification information such as a barcode in mounting a tape for supplying a part on a tape feeder. Accordingly, these modifications are described as reference examples hereinafter.

1. Tape Monitoring Processing (Reference Example)

FIG. 20 is a flowchart showing the reference example of tape monitoring processing.

Firstly, the tape monitoring part 71c sets an initial value "1" as a counter value of a set position counter (step S51), and the tape monitoring part 71c determines whether or not the tape 60 is removed from the tape feeder 5 (step S55) by referencing an output signal of the second tape detection sensor 48b at the set position "n" (step S53). If the determination result is Yes in step S55, the tape monitoring part 71c changes data at the set position "n" in tape presence or absence data from "presence" to "absence", stores the tape presence or absence data in an updated manner (step S71), and, thereafter, determines whether or not alarm processing described later is performed with respect to the tape feeder 5 at the set position "n" (step S73). When the tape monitoring part 71c determines that alarm processing is performed, the tape monitoring part 71c stops such alarm processing (step S75) and advances processing to step S59.

If the determination result is No in step S55, the tape monitoring part 71c determines whether or not the tape 60 is mounted on the tape feeder 5 at the set position "n (step S57)". If the determination result is No in step S57, the tape monitoring part 71c advances processing to step S59.

On the other hand, if the determination result is Yes in step S57, the tape monitoring part 71c determines whether or not part verification processing is underway with respect to the set position of the tape feeder 5 on which the tape 60 is mounted, that is, whether or not a part verification processing flag (step S81 in FIG. 21) is set (step S61).

If the determination result is No in step S61, the tape monitoring part 71c instructs an operator to read a part ID (barcode 66). For example, the tape monitoring part 71c controls display device 81 so as to make the display device 81 to display a message which requests reading of a part ID using the barcode reader 84 together with information capable of identifying the set position of the tape feeder 5 on which the tape 60 is mounted (step S67).

On the other hand, if the determination result is Yes in step S61, the tape monitoring part 71c determines whether or not tape mounting permission is present with respect to the set position "n" of the tape feeder 5 on which the tape 60 is mounted in step S57, that is, whether or not a tape mounting permission flag described later (step S91 shown in FIG. 21) is set (step S63). If the determination result is No in step S63, the tape monitoring part 71c determines that erroneous mounting of the tape 60 occurs and performs alarm processing (step S69) and, thereafter, the tape monitoring part 71c changes data at the set position "n" in tape presence or absence data from "absence" to "presence", stores the tape presence or absence data in an updated manner (step S64), and advances processing to step S59. On the other hand, if the determination result is Yes in step S63, the tape monitoring part 71*c* changes data at the set position "n" in tape presence or absence data from "absence" to "presence" without performing alarm processing, stores the tape presence or absence data in an updated manner (step S64), and advances processing to step S59.

In step S69, for example, the tape monitoring part 71*c* outputs a control signal so as to make the display device 81 display the fact that erroneous mounting of the tape 60 has occurred and the set position "n", and to make the alarm lamp 83 operate. Further, the tape monitoring part 71*c* outputs a control signal to the tape feeder 5 set at the set position "n" so as to turn on (or flicker) the LED display part 51*b*. Accordingly, the tape monitoring part 71*c* makes an operator recognize the set position "n" and the tape feeder 5 each corresponding to the tape 60 and the fact that a part ID is not read.

In step S59, the tape monitoring part 71*c* determines whether or not a counter value of the set position counter is equal to the total number N of the set positions. If the determination result is No in step S59, the tape monitoring part 71*c* inclement the counter value by "1" and advances processing to step S53 (step S78). If the determination result is Yes in step S59, the tape monitoring part 71 resets the counter value to "0" (step S60) and thereafter, the tape monitoring part 71*c* makes processing return to step S51.

2. Part Verification Processing (Reference Example)

FIG. 21 is a flowchart showing the reference example of part verification processing.

The part verification processing starts at a point of time that the tape 60 is mounted in any one of tape feeders 5 (Yes in step S57), and the tape monitoring part 71*c* determines that part verification processing is not underway (No in step S61) in tape monitoring processing.

When part verification processing starts, the part verification part 71*b* sets a part verification processing flag (step S81), and waits reading of a part ID (barcode 66) in accordance with a message displayed on the display device 81 (step S67 shown in FIG. 20) (step S83).

When the part ID is read (Yes in step S83), the part verification part 71*b* identifies the set position of the object feeder 5 on which a part corresponding to the part ID is to be mounted (object set position) based on the part ID and the part verification data of database (see FIG. 10), turns on (or flickers) the LED display part 51*b* of the object feeder 5 and operates the timer part 71*d* (steps S85 to S89).

Next, the part verification part 71*b* sets a tape mounting permission flag with respect to the object set position identified in step S85 (step S91). Then, the part verification part 71*b* determines whether or not the tape 60 is actually mounted on the object feeder 5 by referencing an output signal from the second tape detection sensor 48*b* of the object feeder 5 set at the object set position (steps S93, S95).

If the determination result is Yes in step S95, the part verification part 71*b* turns off the LED display part 51*b* of the object feeder 5 and, at the same time, stops a display of a message by the display device 81 (stops a part ID reading instruction). Further, the part verification part 71*b* sequentially releases a part mounting permission flag and a part verification processing flag (steps S97 to S103) and thereafter, finishes the part verification processing.

On the other hand, if the determination result is No in step S95, the part verification part 71*b* determines whether or not a timeout comes, that is, whether or not a set time is counted by the timer part 71*d* (step S107). If the determination result is No in step S107, the part verification part 71*b* advances processing to step S93. On the other hand, if the determination result is Yes in step S107, the part verification part 71*b* advances processing to step S97.

If the determination result is Yes in step S95, it is confirmed by the part verification part 71*b* that the part verification is correctly performed, that is, the tape 60 which supplies a part having a desired part ID is correctly set at the set position. The part verification part 71*b* stores this information in the memory part 72, and performs loading of the tape 60 when a command of loading the tape 60 is generated in response to the detection of part running out of the preceding tape 60 or an operation of the operation button 51*a*.

When the part verification part 71*b* determines that reading of a part ID is not performed during a period that determination processing in step S83 is performed by processing loop numbers Na after a part verification processing flag is set in step S81 (Yes in step S105), the part verification part 71*b* skips processing in steps S83 to S101, advances processing to step S103, and releases the part verification processing flag.

3. Functions and Effects of Reference Example

The functions and effects of the reference example are substantially equal to the functions and effects acquired by the example shown in FIG. 11 and FIG. 12. That is, when an operator mounts the tape 60 on any one of tape feeders 5, a message which requests reading of a part ID (barcode 66) using the barcode reader 84 is displayed by the display device 81. Accordingly, the operator is requested to read the part ID with respect to the tape 60.

When reading of the part ID is properly performed and the tape 60 is mounted on the object feeder 5, the LED display part 51*b* is turned off and, at the same time, a display of a message by the display device 81 is stopped (steps S97, S99 shown in FIG. 21). Accordingly, the operator can recognize that the tape 60 is properly mounted on the object feeder 5. In this case, the determination result is Yes in step S64 of tape verification processing, and tape presence or absence data is updated.

On the other hand, when reading of a part ID by the barcode reader 84 is not performed in a state where the above-mentioned message is displayed by the display device 81 (No in step S105 shown in FIG. 21), in part verification processing, a state where a tape mounting permission flag is not set continues. Accordingly, in this case, the determination result is No in step S63 of tape monitoring processing, and alarm processing is performed (step S69). Accordingly, an operator is requested to perform reading of a part ID with respect to the tape 60.

When part verification processing is finished in a state where reading of a part ID using the barcode reader 84 is not performed (Yes in step S105 shown in FIG. 21) or when the tape 60 is mounted on the tape feeder 5 which is different from the object feeder 5 and the tape 60 is not remounted on the object feeder 5 within the above-mentioned set time, eventually, in tape monitoring processing, it is determined that the tape 60 is mounted on the tape feeder 5, a message which requests reading of a part ID using the barcode reader 84 is displayed, and part verification processing is performed (steps S57, S61, S67 shown in FIG. 20).

Accordingly, it is possible to suppress the occurrence of a drawback that the tape 60 mounted on the tape feeder 5 is left in a state where reading of a part ID is not performed using the barcode reader 84, the tape 60 is mounted on the tape feeder 5 on a trial basis, and such a mounting state of the tape 60 is forgotten and is left as it is, and eventually, it is possible to suppress the occurrence of a trouble such as a defect in supplying parts on the tape feeder 5 attributed to the fact that the above-mentioned state is left.

In this manner, the functions and effects of the reference examples is basically substantially equal to the functions and effects based on the example shown in FIG. 11 and FIG. 12. However, in tape monitoring processing shown in FIG. 12 described previously, substantial processing for detecting erroneous mounting of the tape 60 (processing of steps S5 to S9 and steps S15, S17 shown in FIG. 11) is performed within a period which differs from a period during which part verification processing is performed. On the other hand, in tape monitoring processing shown in FIG. 20, processing of detecting erroneous mounting of tape 60 (processing of steps S53 to S57 and steps S61 to S75 shown in FIG. 20) is performed regardless of whether or not part verification processing is underway. This point is the largest difference between the above-mentioned embodiment and the above-mentioned reference examples.

The present disclosure which has been described heretofore can be recapitulated as follows.

The present disclosure provides a part verification system for a part supply unit where a plurality of tape feeders are arranged, the part verification system being provided for determining whether or not a tape for supplying parts mounted on the tape feeder is appropriate, the part verification system including: sensors provided to the plurality of tape feeders, the sensors being configured to detect tapes, respectively; a reader configured to read identification information of an accommodated part from a recording part which records the identification information and is provided to a tape or a reel around which the tape is wound; a memory part configured to store part verification information obtained by correlating set position information which is information on a set position of the tape feeders in the part supply unit with the identification information; a part verification part configured to perform verification updating processing for determining, when the identification information of the tape is read using the reader, whether or not the tape is actually mounted on the tape feeder at the set position corresponding to the identification information based on the identification information, the part verification information and an output from the sensor, and updating tape presence or absence information at the set position when the part verification part determines that the tape is mounted; a tape monitoring part configured to perform tape detection processing for determining whether or not the tape is mounted with respect to each tape feeder based on the output from the sensor and the tape presence or absence information during a period which differs from a period where the verification updating processing is performed; and a notification part configured to notify so as to request reading of the identification information relating to the tape from the recording part when the tape monitoring part determines that the tape is mounted on the tape feeder.

According to this part verification system, when the tape is mounted on the tape feeder, mounting of the tape is detected in tape detection processing, and information or the like which requests reading of identification information of the tape is notified by the notification part. When an operator reads the identification information in accordance with such a request, part verification processing is performed. In part verification processing, when the tape is actually mounted at the set position corresponding to the identification information, tape presence or absence information of the set position is updated. On the other hand, the tape at the set position corresponding to the identification information is not mounted, such a state becomes an object of notification by the notification part until the tape is mounted at the set position corresponding to the identification information. In this manner, according to this part verification system, it is possible to suppress the occurrence of a drawback that the tape mounted on the tape feeder is left in a state where reading of identification information using the reader is not performed or the tape is mounted on the tape feeder on a trial basis and such a mounting state of the tape is forgotten and is left as it is.

It is preferable that the above-mentioned part verification system include a timer part configured to count a time which is set preliminarily as a time within which the tape is mountable on the tape feeder and the tape is remountable, in synchronism with reading of the identification information using the reader, and the part verification part be configured to update the tape presence or absence information when the part verification part determines that the tape is mounted on the tape feeder at a set position corresponding to the identification information read using the reader during a period until counting of the set time by the timer part is completed.

With such a configuration, even when the tape whose identification information is read using the reader is erroneously mounted on the tape feeder at the set position which differs from the set position corresponding to the identification information, such erroneous mounting is not detected in tape monitoring processing by remounting the tape within the set time. That is, it is possible to prevent such a state from becoming a notification object by the notification part. Accordingly, it is possible to eliminate cumbersomeness that the case where an operator immediately recognizes erroneous mounting and can be remount the tape also becomes a notification object of the notification part in the same manner.

In this case, it is preferable that the set time be a time during which the tape is remountable on the tape feeder plural times.

With such a configuration, an operator can remount the tape with further tolerance. Accordingly, the operator can perform the tape remounting operation more accurately and with more certainty.

In this case, it is preferable that the part verification part be configured to perform first detection processing for detecting presence or absence of the tape at each of the tape feeders prior to the verification updating processing, be configured to perform second detection processing for detecting presence or absence of the tape at each of the tape feeders after updating of the tape presence or absence information in the verification updating processing, and be configured to perform reset processing for resetting tape presence or absence information which is updated in the verification updating processing to the information before updating when a total number of tapes detected by the second detection processing is increased by 2 or more compared to a total number of the tapes detected in the first detection processing.

With such a configuration, when the tape having identification information read using the reader within the set time is mounted on the tape feeder which is not the tape feeder at the set position corresponding to the identification information (object set position) and, immediately after such mounting, another tape is mounted on the tape feeder at the object set position, it is possible to avoid missing of erroneous mounting of the tape mounted on the tape feeder at the object set position as it is.

It is preferable that the above-mentioned tape erroneous mounting detection system further include a display part configured to visually identify the set position corresponding to the identification information read by the reader or the tape feeder set at the set position.

With such a configuration, the position of the tape feeder corresponding to identification information can be easily grasped and hence, when the tape is erroneously mounted on the tape feeder at the set position which differs from the object set position, the correction of the set position can be speedily performed.

In this case, it is preferable that the display part be provided to each of the plurality of tape feeders.

With such a configuration, the positions of the tape feeders corresponding to identification information can be more easily grasped.

The invention claimed is:

1. A part verification system for a part supply unit where a plurality of tape feeders are arranged, the part verification system being provided for determining whether or not a tape for supplying parts mounted on the tape feeder is appropriate, the part verification system comprising:
   sensors provided to the plurality of tape feeders, the sensors being configured to detect tapes, respectively;
   a reader configured to read identification information of an accommodated part from a recorder which records the identification information and is provided to a tape or a reel around which the tape is wound;
   a memory connected to a memory part configured to store part verification information correlating set position information which is information on a set position of the tape feeders in the part supply unit with the identification information;
   a part verification processing system having an arithmetic processing part performs part verification processing operations and determines when the identification information of the tape is read using the reader, whether or not the tape is actually mounted on the tape feeder at the set position corresponding to the identification information based on the identification information, the part verification information and an output from the sensor, to perform verification updating processing, that is, updating tape presence or absence information at the set position when the part verification processing system determines that the tape is mounted on the tape feeder at the set position;
   a tape monitor configured to perform tape detection processing for determining that the tape is mounted on the tape feeder without reading of identification information using the reader based on the output from the sensor;
   a timer configured to count a time which is set preliminarily as a time period within which the tape is mountable and is remountable on the tape feeder in synchronism with reading of the identification information using the reader; and
   a notifier configured to notify so as to request the reading of the identification information relating to the tape from the recorder when the tape monitor determines that the tape is mounted on the tape feeder.

2. The part verification system according to claim 1, wherein the part verification processing system is configured to update the tape presence or absence information when the part verifier determines that the tape is mounted on the tape feeder at a set position corresponding to the identification information read using the reader during a period until counting of the set time by the timer is completed.

3. The part verification system according to claim 2, wherein the set time is a time during which the tape is remountable on the tape feeder plural times.

4. The part verification system according to claim 2, wherein the part verification processing system is configured to perform first detection processing for detecting presence or absence of the tape at each of the tape feeders prior to the verification updating processing, is configured to perform second detection processing for detecting presence or absence of the tape at each of the tape feeders after updating of the tape presence or absence information in the verification updating processing, and is configured to perform reset processing for resetting tape presence or absence information which is updated in the verification updating processing to the information before updating when a total number of tapes detected by the second detection processing is increased by 1 or more compared to a total number of the tapes detected in the first detection processing.

5. The part verification system according to claim 1, further comprising a display configured to display visually identify the set position corresponding to the identification information read using the reader or the tape feeder set at the set position.

6. The part verification system according to claim 5, wherein the display is provided to each of the plurality of tape feeders.

7. The part verification system according to claim 3, wherein the part verification processing system is configured to perform first detection processing for detecting presence or absence of the tape at each of the tape feeders prior to the verification updating processing, is configured to perform second detection processing for detecting presence or absence of the tape at each of the tape feeders after updating of the tape presence or absence information in the verification updating processing, and is configured to perform reset processing for resetting tape presence or absence information which is updated in the verification updating processing to the information before updating when a total number of tapes detected by the second detection processing is increased by one or more compared to a total number of the tapes detected in the first detection processing.

8. The part verification system according to claim 2, further comprising a display configured to display the set position corresponding to the identification information read using the reader or the tape feeder set at the set position.

9. The part verification system according to claim 3, further comprising a display configured to display the set position corresponding to the identification information read using the reader or the tape feeder set at the set position.

10. The part verification system according to claim 4, further comprising a display configured to display the set position corresponding to the identification information read using the reader or the tape feeder set at the set position.

11. The part verification system according to claim 7, further comprising a display configured to display the set position corresponding to the identification information read using the reader or the tape feeder set at the set position.

12. The part verification system according to claim 8, wherein the display is provided to each of the plurality of tape feeders.

13. The part verification system according to claim 9, wherein the display is provided to each of the plurality of tape feeders.

14. The part verification system according to claim 10, wherein the display is provided to each of the plurality of tape feeders.

15. The part verification system according to claim 11, wherein the display is provided to each of the plurality of tape feeders.

\* \* \* \* \*